US009912786B2

(12) United States Patent
Yosoku et al.

(10) Patent No.: US 9,912,786 B2
(45) Date of Patent: Mar. 6, 2018

(54) WIRELESS COMMUNICATION DEVICE AND METHOD TO DETECT HEADER INFORMATION ERRORS

(71) Applicant: PANASONIC CORPORATION, Osaka (JP)

(72) Inventors: Naoya Yosoku, Kanagawa (JP); Hiroyuki Yoshikawa, Tokyo (JP); Naganori Shirakata, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 470 days.

(21) Appl. No.: 14/110,382

(22) PCT Filed: Feb. 27, 2013

(86) PCT No.: PCT/JP2013/001168
§ 371 (c)(1),
(2) Date: Oct. 7, 2013

(87) PCT Pub. No.: WO2013/136694
PCT Pub. Date: Sep. 19, 2013

(65) Prior Publication Data
US 2014/0086229 A1 Mar. 27, 2014

(30) Foreign Application Priority Data
Mar. 13, 2012 (JP) .................. 2012-056115

(51) Int. Cl.
*H04L 29/06* (2006.01)
*H04L 1/00* (2006.01)
(Continued)

(52) U.S. Cl.
CPC ......... *H04L 69/22* (2013.01); *H03M 13/1111* (2013.01); *H03M 13/6325* (2013.01);
(Continued)

(58) Field of Classification Search
USPC ........................................... 370/338
See application file for complete search history.

(56) References Cited

U.S. PATENT DOCUMENTS

| 9,106,364 B1 * | 8/2015 | Singleton ................. H04K 1/00 |
| 2004/0076239 A1 * | 4/2004 | Yu ..................... H04L 25/03159 375/260 |

(Continued)

FOREIGN PATENT DOCUMENTS

| JP | 3194878 B2 | 6/2001 |
| JP | 2005-167389 A | 6/2005 |

(Continued)

OTHER PUBLICATIONS

Harada et al., "Complete Proposal for 802.11ad," IEEE 802.11-10-0498-03-00ad, May 2010, pp. 1, 2, 21, 22, 26-30.

(Continued)

*Primary Examiner* — Alpus H Hsu
*Assistant Examiner* — Hooman Houshmand
(74) *Attorney, Agent, or Firm* — Seed IP Law Group LLP

(57) ABSTRACT

A demodulation section demodulates a received signal. A decoding section decodes an output from the demodulation section. A buffer temporarily stores a portion of the received signal. A header analyzing section gives the buffer timing at which demodulation and decoding of a payload of the received signal are initiated, on the basis of a result of combination of a plurality of header sequences included in a header of the received signal and results of processing of the demodulation section and the decoding section. An improved SNR is achieved by means of combination of the plurality of header sequences, so that an iterative decoding count used for decoding the header become smaller.

18 Claims, 16 Drawing Sheets

(51) Int. Cl.
*H03M 13/00* (2006.01)
*H03M 13/11* (2006.01)
*H04L 25/03* (2006.01)

(52) U.S. Cl.
CPC ........ *H03M 13/6527* (2013.01); *H04L 1/005* (2013.01); *H04L 1/0057* (2013.01); *H04L 1/0063* (2013.01); *H04L 1/0072* (2013.01); *H04L 25/03057* (2013.01)

(56) References Cited

U.S. PATENT DOCUMENTS

| | | | |
|---|---|---|---|
| 2005/0058193 A1* | 3/2005 | Saed | H04L 25/03159 375/232 |
| 2006/0172716 A1* | 8/2006 | Yoshii | H04L 27/2647 455/226.1 |
| 2007/0047630 A1* | 3/2007 | Yamauchi | H04B 1/7093 375/150 |
| 2007/0116012 A1* | 5/2007 | Chang | H04W 48/18 370/395.52 |
| 2007/0133718 A1* | 6/2007 | Lee | H04L 1/005 375/341 |
| 2008/0002780 A1* | 1/2008 | Yu | H04L 1/0041 375/267 |
| 2008/0008117 A1* | 1/2008 | Alizadeh-Shabdiz | G01S 5/02 370/328 |
| 2008/0225982 A1 | 9/2008 | Chrabieh et al. | |
| 2009/0199073 A1 | 8/2009 | Kanaoka et al. | |
| 2009/0207780 A1* | 8/2009 | Kishigami | H04W 88/08 370/328 |
| 2010/0074369 A1* | 3/2010 | Seki | H04J 11/0076 375/302 |
| 2010/0115372 A1* | 5/2010 | Trachewsky | H03M 13/1102 714/752 |
| 2010/0166089 A1* | 7/2010 | Seki | H04J 11/0069 375/260 |
| 2011/0194625 A1* | 8/2011 | Hou-Shin | H04L 5/0053 375/257 |

FOREIGN PATENT DOCUMENTS

| | | |
|---|---|---|
| JP | 2009-181656 A | 8/2009 |
| JP | 2010-081014 A | 4/2010 |
| JP | 2010-521929 A | 6/2010 |

OTHER PUBLICATIONS

Korb et al., "Area and Latency Optimized High-Throughput Min-Sum Based LDPC Decoder Architectures," IEEE 978-1-4244-4353, Jun. 2009, 4 pages.

International Search Report, dated Apr. 16, 2013, for PCT/JP2013/001168, 4 pages.

Notification of Reasons for Refusal, dated Apr. 12, 2016, for corresponding JP Application No. 2013-243071, 6 pages. (With English Translation).

* cited by examiner

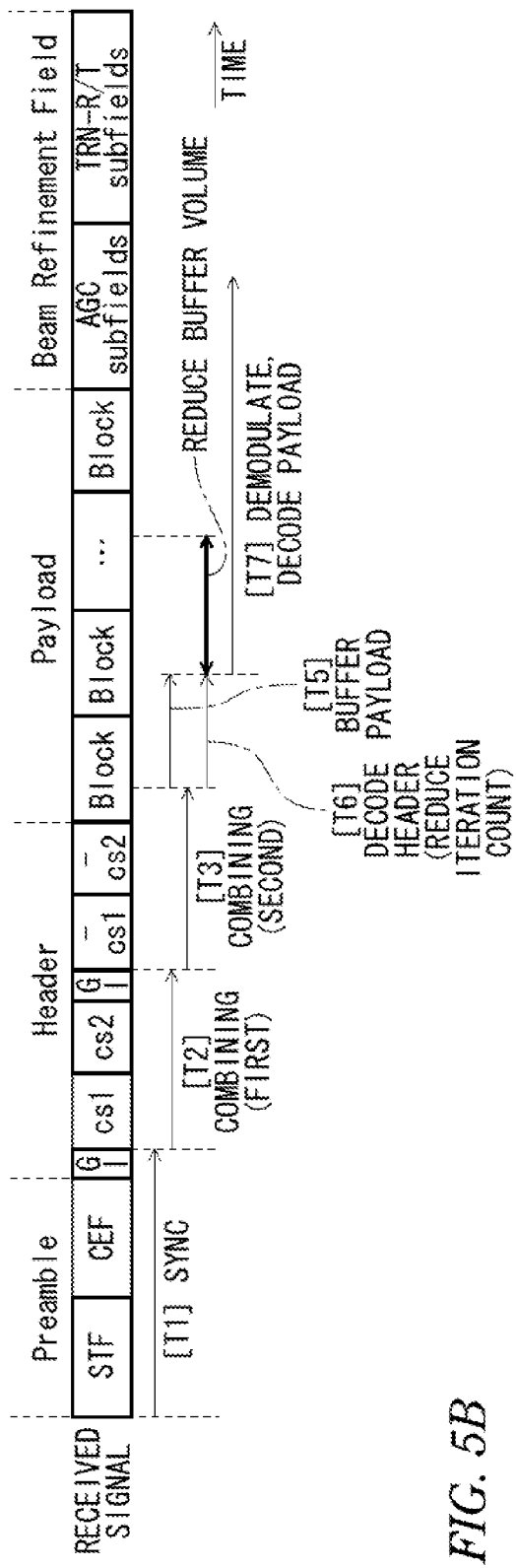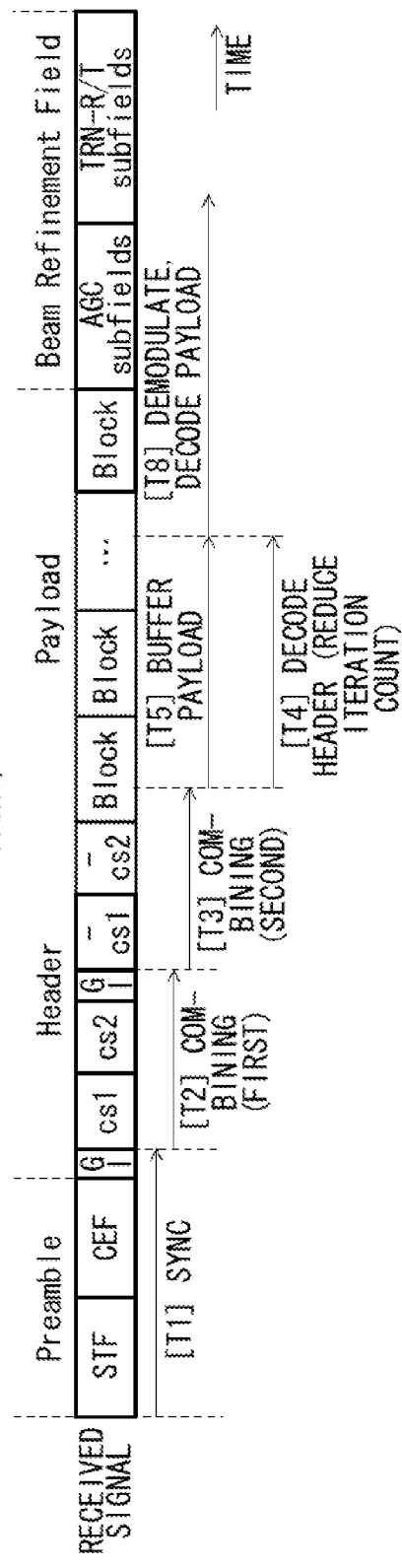
FIG. 5A
FIG. 5B

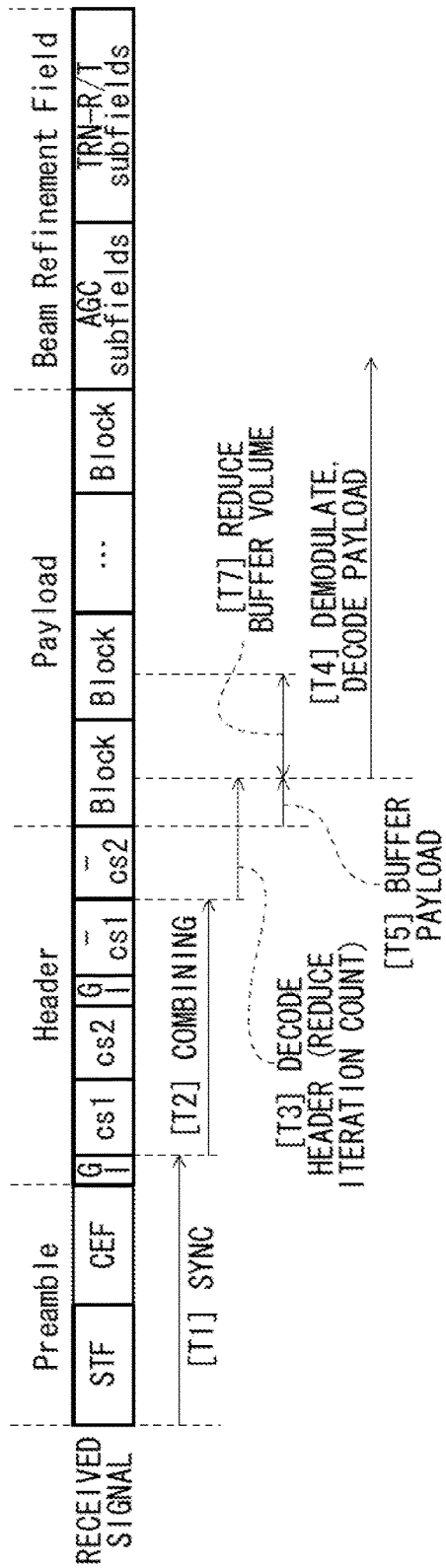
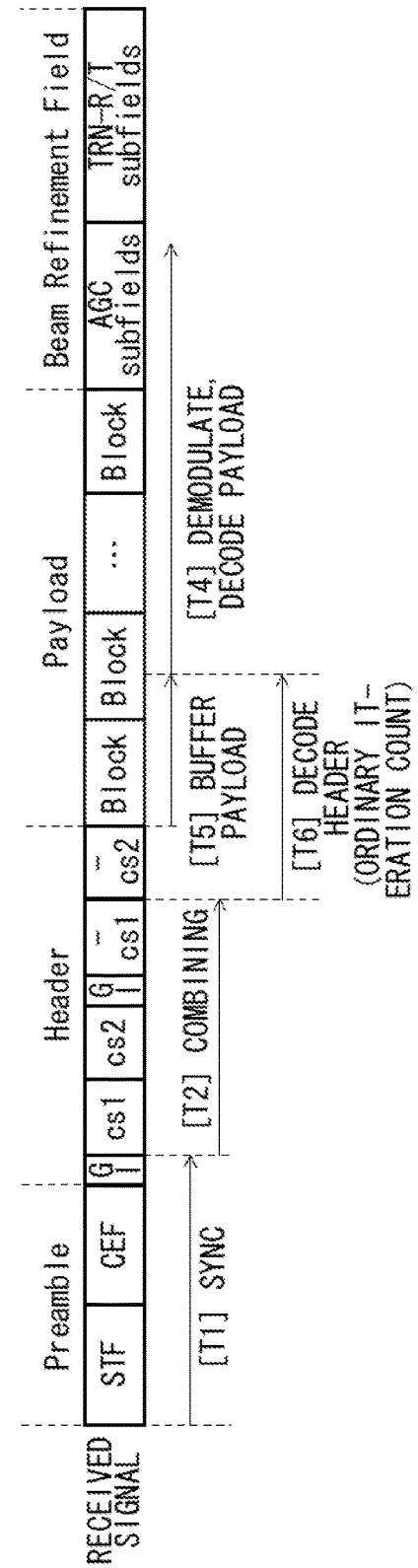
FIG. 9A
FIG. 9B

WIRELESS COMMUNICATION DEVICE AND METHOD TO DETECT HEADER INFORMATION ERRORS

TECHNICAL FIELD

The invention relates to a wireless communication device and a wireless communication method for decoding a header in a packet communication system.

BACKGROUND ART

In a packet communication system, when a receiver receives a packet, a header is heretofore demodulated and decoded before data (a payload) of the packet is demodulated and decoded. The header includes control information that is necessary to demodulate and decode the payload. After decoding of the header is completed, demodulation of the payload is initiated.

A wireless communication standard using a packet communication system; for instance, "IEEE802.11ad," uses an LDPC (Low Density Parity Check) code is used for a packet header (see; for instance, Non-Patent Document 1). Non-Patent Document 1 discloses an LDPC decoding method that enables implementation of a high throughput.

RELATED ART DOCUMENT

Non-Patent Document

Non-Patent Document 1: "Area and latency Optimized High-Throughput Min-Sum Based LDPC Decoder Architectures," IEEE, 2009

SUMMARY OF THE INVENTION

Problems to be Solved by the Invention

The packet communication system does not commence demodulation of the payload until decoding of the header ends. For instance, when a packet header is decoded by means of an LDPC code, as specified in the "IEEE802.11ad" standard, the receiver demodulates the header and decodes an LDPC code after receiving a received signal including the header, subsequently acquiring a header as control information. After acquiring the header, the receiver can start demodulating the payload.

For instance, a "sum-product" algorithm and a "min-sum" algorithm have hitherto been known as an algorithm for decoding an LDPC code. The decoding algorithms, however, are iterative decoding techniques and, hence, consume much time in decoding a header. The receiver must temporarily retain in a buffer a payload received before completion of decoding of the header. As time involved in decoding the header becomes longer, a buffer size required to retain the payload becomes larger.

A disclosure is made in light of the above-mentioned circumstances of the related art and aims at providing a wireless communication device and a wireless communication method for decoding a header at high speed, to thus reduce time involved in demodulating and decoding a payload.

This disclosure is directed toward a wireless communication device configured to receive a signal with a frame format including a plurality of header sequences, comprising: a demodulation section configured to demodulate the plurality of header sequences; and a decoding section configured to decode the modulated header sequences, to thereby acquire header information of the signal.

This disclosure is also directed toward a wireless communication method for receiving a signal with a frame format which has a plurality of header sequences, comprising: demodulating the plurality of header sequences; and decoding the demodulated header sequences, to thus acquire header information of the signal.

Advantage of the Invention

According to the disclosure, time involved in decoding a header at high speed and demodulating and decoding a payload can be reduced.

BRIEF DESCRIPTION OF THE DRAWINGS

FIGS. 5A and 5B are timing charts showing a specific example of receipt processing timing, wherein FIG. 5A shows an example of operation of the wireless communication device of the embodiment and FIG. 5B shows a comparative example of ordinary iteration counts made when an LDPC decoding section decodes a header.

FIGS. 7A and 7B are timing charts showing a specific example of receipt processing timing of the wireless communication device shown in FIG. 6, wherein FIG. 7A shows an example of operation of the wireless communication device of the embodiment and FIG. 7B shows a comparative example of a case where a final header sequence (−cs2) included in a header is demodulated and decoded.

FIGS. 9A and 9B are timing chart showing a specific example of receipt processing timing of the wireless communication device shown in FIG. 8, wherein FIG. 9A shows an example of operation performed by the wireless communication device of the embodiment and FIG. 9B shows a comparative example of ordinary iteration counts made when the LDPC decoding section decodes a header.

MODE FOR CARRYING OUT THE INVENTION

Respective embodiments of a wireless communication device and a wireless communication method of the disclosure are hereunder described by reference to the drawings. Although explanations are provided to the respective embodiments by use of wireless communication devices of the disclosure, the disclosure may also be described as a wireless communication method that defines operation of the wireless communication device.

<First Embodiment>

<Signal Frame Format>

Figure 1:
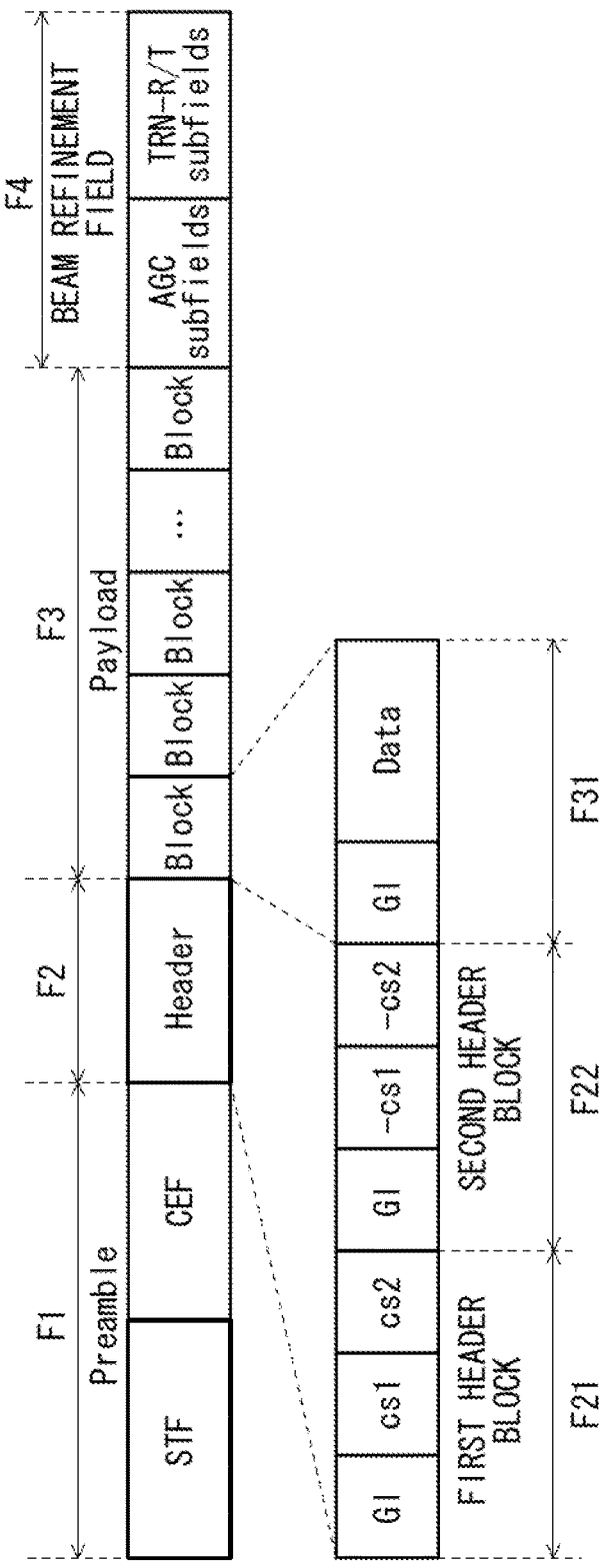
FIG. 1 is a frame format showing a format of a PHY frame of a received signal.

FIG. 1 shows a format of a physical layer (PHY) frame that serves as a signal used in communication by a wireless communication device of the embodiment. The frame format is used in high-speed decoding of a PHY header.

The PHY frame shown in FIG. 1 includes fields designated as "Preamble F1" "Header F2," "Payload F3," and "Beam Refinement field F4."

The preamble F1 includes an STF (Short Training Field) and a CEF (Channel Estimation Field). A known sequence that is previously defined in a communication system; for instance, a "Golay" sequence, is used for the STF and the CEF.

The header F2 includes a known sequence called a GI (Guard Interval), a block F21 made by concatenation of a control signal "cs1" with a control signal "cs2"; and a block F22 made by concatenation of a control signal "−cs1" with a control signal "−cs2." The header F2 stores information that is used in communication management.

The payload F3 includes a plurality of blocks; more specifically, a plurality of blocks F31 that are made by concatenation of the GI sequence with data corresponding to an information signal of a data body.

Reference symbol "cs1" designates a signal sequence formed by error correction coding control information required to demodulate and decode a PHY frame. The sequence cs1 is hereunder defined as a "first header sequence." An LDPC code or a turbo code is used for error correction coding. In the embodiment, explanations are provided by use of the LDPC code.

Reference symbol "cs2" designates a sequence of a signal which is formed by scrambling the "cs1" sequence. The sequence "cs2" is hereunder defined as a "second header sequence." A known fixed sequence that is previously specified in the packet communication system is used for scrambling. A block F21 which is shown in FIG. 1 and made by concatenation of the "GI" sequence, the "cs1" sequence, and the "cs2" sequence is defined as a "first header block." In the PHY frame of the embodiment, the "first header block" is followed by a "second header block" that is made by concatenation of the "GI" sequence, the "−cs1" sequence, and the "−cs2" sequence. In this respect, the "−cs1" sequence and the "cs1" sequence are complementary to each other. The "−cs2" sequence and the "cs2" sequence are complementary to each other.

Specifically, in the PHY frame shown in FIG. 1, a field of the header F2 is made by concatenation of a field of the first header block F21 with a field of the second header block F22. The "−cs1" sequence and the "−cs2" sequence of the second header block F22 are hereunder defined as a "third header sequence" and a "fourth header sequence," respectively.

A bit sequence (data body) that a transmitter embodied as a wireless communication device transmits to a receiver embodied as a wireless communication device is hereunder defined as an "information bit."

The transmitter subjects an "information bit" to be transmitted to error correction coding according to an error correction coding method and an error correction coding rate described in the header F2. Further, in accordance with a modulation method described in the header F2, the transmitter modulates an error correction code bit produced through error correction coding. "Data"; namely, an information bit, is formed from a modulated signal obtained by modulation. The transmitter transmits a signal frame ("PHY frame") that includes the payload F3 storing "data" to the receiver embodied as the wireless communication device 10 of the embodiment.

The modulation method, the error correction coding method (LDPC code), and the error correction code rate which are described in the header F2 are hereunder collectively defined as an "MCS" (Modulation and Coding Scheme).

A "Beam Refinement Field F4" of the PHY frame shown in FIG. 1 is an option field and used as a training field for; for instance, beam foaming. The option field is not always used in communication and used for training of beam foaming between the transmitter and the receiver.

In the embodiment, the transmitter transmits a PHY frame to the receiver by means of single carrier transmission.

<Brief Overview of the Configuration and Operation of the Wireless Communication Device>

Figure 2:
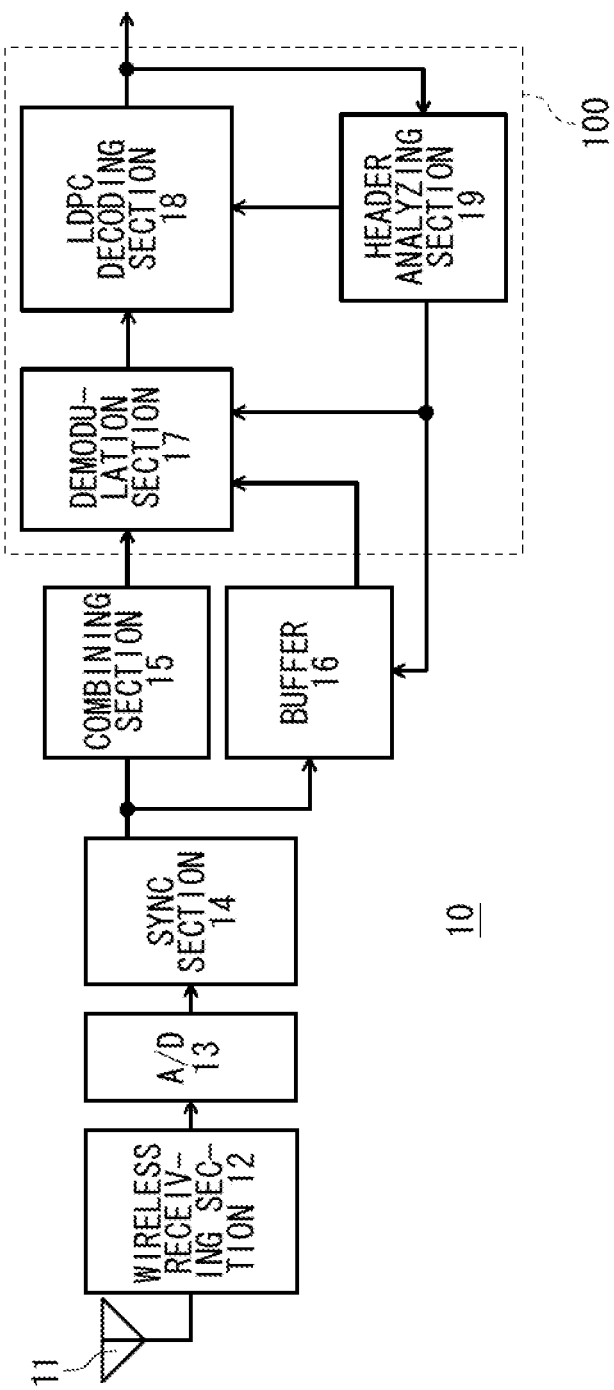
FIG. 2 is a block diagram showing a configuration of a wireless communication device of a first embodiment.

FIG. 2 shows a configuration of the wireless communication device 10 of the embodiment. A physical layer signal frame included in a wireless signal received by the wireless communication device 10 has the same format as that of the PHY frame. To be specific, an unillustrated transmitter transmits a wireless signal including a PHY frame, and the wireless communication device 10 shown in FIG. 2 receives the wireless signal.

The wireless communication device 10 shown in FIG. 2 can decode a header of the PHY frame of the received signal at high speed. Incidentally, the wireless communication device 10 can also exhibit a function of the transmitter.

The wireless communication device 10 shown in FIG. 2 includes an antenna 11, a wireless receiving section 12, an A/D conversion section 13, a sync section 14, a combining section 15, a buffer 16, a demodulation section 17, an LDPC decoding section 18, and a header analyzing section 19. The combining section 15, the demodulation section 17, the LDPC decoding section 18, and the header analyzing section 19 configure a standby time control section 100.

A received signal including the PHY frame is received by the antenna 11 and converted into a baseband signal by the wireless receiving section 12. The A/D (Analog to Digital) conversion section 13 converts the baseband signal from an analogue signal into a digital signal.

The sync section 14 performs synchronous processing by use of the preamble F1, which is shown in FIG. 1, of the PHY frame of the digital signal that is generated as a result of conversion practiced by the A/D conversion section 13. To be specific, the sync section 14 performs, based on a known sequence of the preamble F1 synchronous processing for correcting a frequency drift of a carrier wave exchanged between the transmitter and the receiver. By use of a known sequence of the preamble F1, the sync section 14 also performs synchronous processing for correcting a frequency drift of a sampling frequency of the transmitter and a frequency drift of a sampling frequency of the receiver.

The received signal subjected to synchronous processing by the sync section 14 is input to the combining section 15. The combining section 15 combines the first header block F21 and the second header block F22, which are shown in FIG. 1, in the PHY frame of the received signal. For instance, known maximum ratio combining, equal gain combining, or selection combining, is used for a combining algorithm to be performed in the combining section 15.

For instance, the combining section 15 performs maximum ratio combining in a situation where changes in a wireless propagation environment are negligibly small in one PHY frame. The combining section 15 practices estimation of the propagation environment by use of the CEF of the preamble F1. The combining section 15 equalizes fading variations occurred in a transmission channel by means of; for instance, an MMSE (Minimum Mean Square Error) or ZF (Zero Forcing). The combining section 15 can thereby lessen a distortion occurred in the received signal and restrain influence of fading fluctuations.

The combining section 15 adds the "cs1" sequence and the "cs2" sequence included in the equalized header F2, thereby performing maximum ratio combining. The combining section 15 can combine the "cs1" sequence with the "cs2" sequence by descrambling the "cs2" sequence, thereby combining a total of four header sequences. When a sequence obtained by descrambling the sequence "cs2" is taken as "cs2'", combining performed in the combining section 15 can be expressed by Equation (1) provided below. Maximum ratio combining can thereby be implemented.

[Mathematical Expression 1]

$$cs1+cs2'+(-1)\times(-cs1)+(-1)\times(-cs2') \qquad (1)$$

cs1: a first header sequence
cs2': a descrambled second header sequence
$(-1)\times(-cs1)$: a code-inverted third header sequence
$(-1)\times(-cs2')$: a descrambled and code-inverted fourth header Since the combining section 15 combines a plurality of header sequences of the PHY frame in the received signal, a time diversity effect is yielded, so that the wireless communication device 10 can enhance an SNR (Signal to Noise Ratio) of the header.

The headers combined by the combining section 15 are input to the demodulation section 17. The demodulation section 17 subjects the combined headers to soft decision. Results of soft decision practiced by the demodulation section 17 (i.e., soft decision values) are input to the LDPC decoding section 18.

The LDPC decoding section 18 subjects the soft decision values output from the demodulation section 17 to error correction decoding by use of an LDPC (Low Density Parity Check) code. Known iterative decoding, like "Sum-Product decoding" and "Min-Sum decoding" is used for decoding operation that is performed by the LDPC decoding section 18.

An iteration count for iterative decoding that is performed by the LDPC decoding section 18 can be made smaller than a predetermined iteration count because the SNR of the header is enhanced by the combining section 15. The word "iteration count" used herein means the number of iterations performed when a payload of a received signal is decoded without the headers being subjected to combining operation of the combining section 15. A reason why the LDPC decoding section 18 requires only a small iteration count is described as follows.

Figure 3:
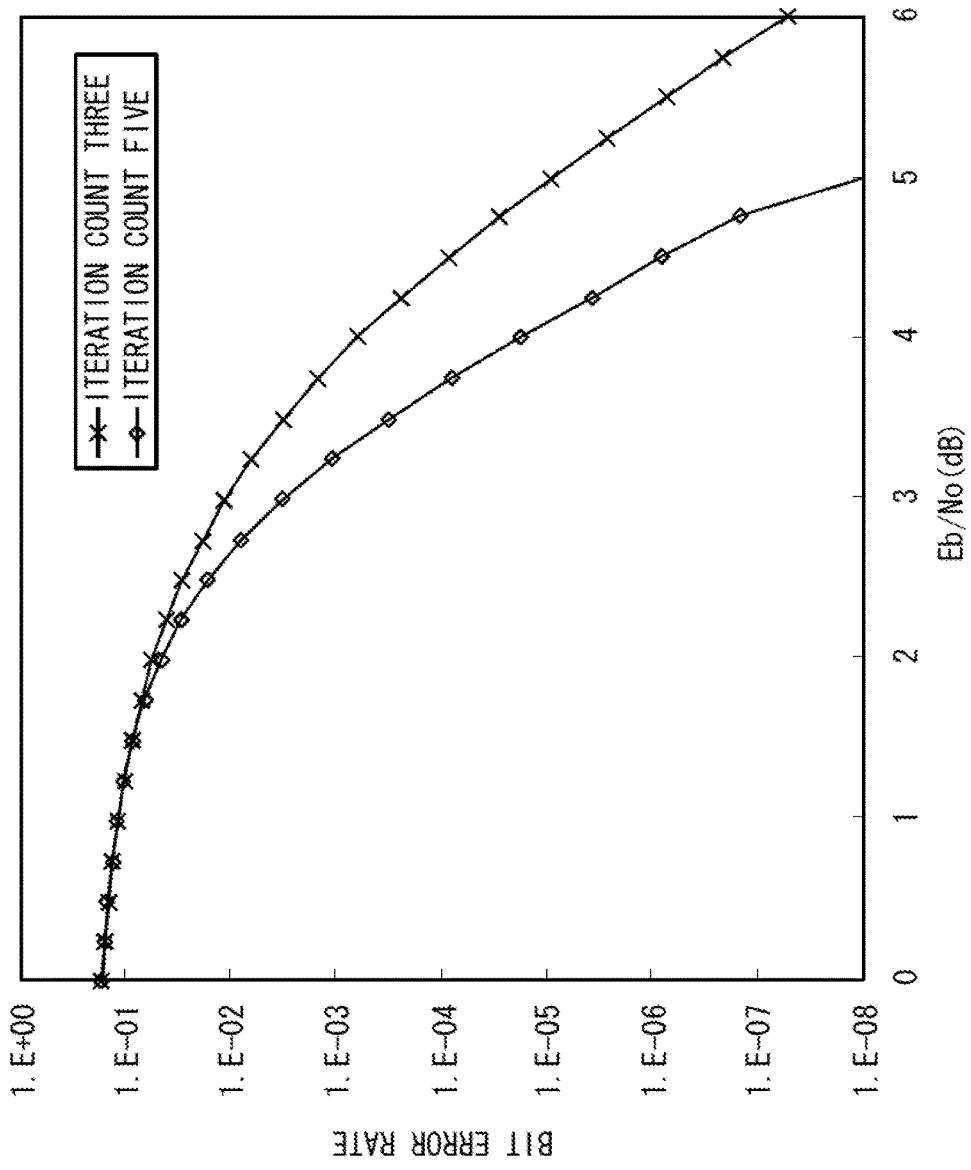
FIG. 3 is a graph showing a bit error rate that is obtained when a signal including a BPSK-modulated LDPC code bit propagates through AWGN.

FIG. 3 is a graph showing a bit error rate achieved after a transmission signal which is made by subjecting an LDPC-coded information bit to BPSK (Binary Phase Shift Keying) modulation has propagated through AWGN (Additive White Gaussian Noise) channel. In FIG. 3, a horizontal axis represents an Eb/NO (Energy per bit to Noise power spectral density ratio); namely, an energy per-bit ratio of a modulated signal with respect to spectral density of noise. FIG. 3 shows BER characteristics of the LPDC decoding section 18 that are acquired respectively at iteration count three and iteration count five.

FIG. 3 shows that an Eb/NO required to accomplish a predetermined bit error rate at five iteration counts is smaller than that required at iteration count three. Therefore, when the LDPC code is decoded, the BER characteristics are improved by increasing the iteration count for decoding. However, as the iteration count for decoding of the LDPC decoding section 18 increases, the decoding time consumed by the LDPC decoding section 18 becomes longer.

In the wireless communication device 10 of the embodiment, an SNR of the header; namely, the Bp/No shown in FIG. 3, is enhanced by means of the combining section 15 subjecting the header to combination. As a consequence, since the BER characteristic is improved by the enhanced Eb/NO when a header is decoded, the iteration count required during the LDPC decoding section 18 decoding the header can be reduced. The LDPC decoding section 18 can thereby decode the header F2 at high speed.

Figure 16:
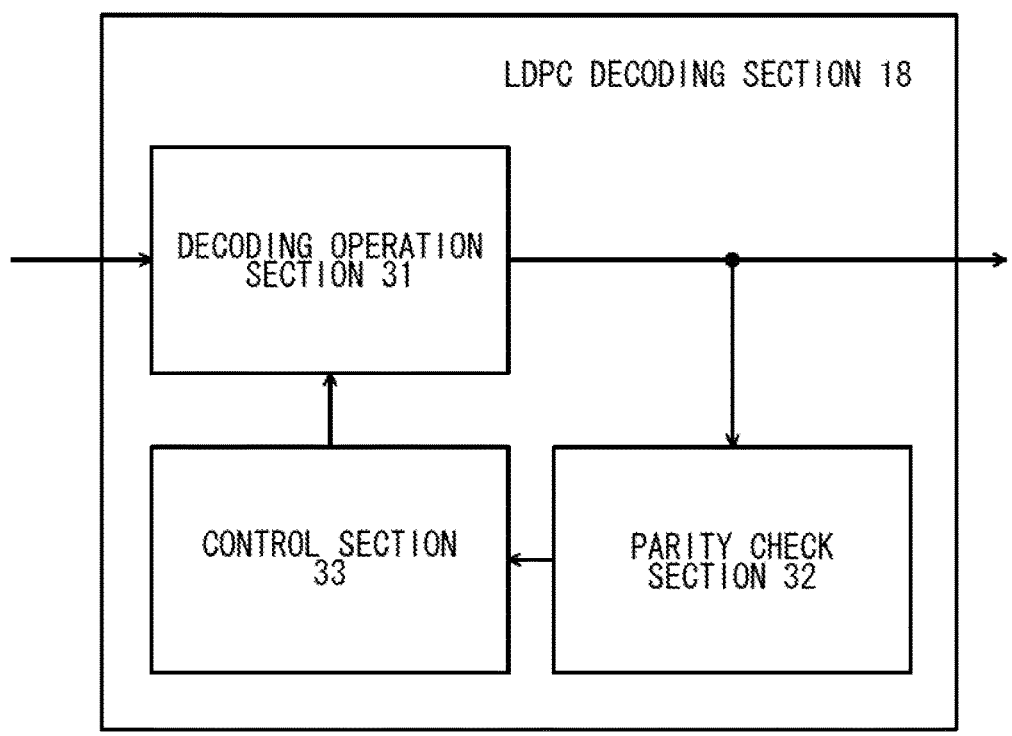
FIG. 16 is a block diagram showing an example of an internal configuration of an LDPC decoding section.

A configuration shown in FIG. 16 can also be taken as a method for reducing the iteration decoding count. FIG. 16 is a block diagram showing an example of an internal configuration of the LDPC decoding section 18. The LDPC decoding section 18 shown in FIG. 16 includes a decoding operation section 31, a parity check section 32, and a control section 33.

The decoding operation section 31 decodes a soft decision value input to the LDPC decoding section 18. The decoding operation section 31 outputs a hard decision value that is a result of decoding. The parity check section 32 subjects the hard decision value output from the decoding operation section 31 to parity check operation. The parity check section 32 inspects whether or not the hard decision value includes a decision error by means of parity check operation. The parity check section 32 outputs an inspection result to the control section 33.

The control section 33 outputs a command for letting the decoding operation section 31 keep performing decoding operation if the decision error exists. In contrast, if the decision error does not exist, the control section 33 will output a command for halting decoding operation to the decoding operation section 31. The SNR is enhanced by means of combination of the headers, so that an iteration count required until no decision error is detected is decreased. Accordingly, by virtue of the configuration of the LDPC decoding section 18 shown in FIG. 16, the LDPC decoding section 18 can halt decoding operation performed by the decoding operation section 31 at an early stage; hence, the power consumed by decoding operation of the LDPC decoding section 18 can be reduced.

Descriptions are provided by referring to FIG. 2 again. The LDPC decoding section 18 outputs to the header analyzing section 19 header information obtained by decoding the header F2 of the received signal. The header analyzing section 19 analyzes an MCS included in the header information, thereby acquiring information about a modulation method applied to the data of the payload and an error correction coding rate.

The header analyzing section 19 outputs the thus-analyzed MCS to the buffer 16, the demodulation section 17, and the LDPC decoding section 18 (a feedback). The buffer 16 stores signal data pertinent to the payload F3 until the header analyzing section 19 finishes analyzing the MCS. After the MCS is fed back, the buffer 16 starts reading the payload F3 stored in the buffer 16, outputting the thus-read payload F3 to the demodulation section 17. Specifically, timing at which demodulating and decoding the payload F3 of the received start comes after timing at which the header analyzing section 19 feeds back the analyzed MCS to the buffer 16.

The demodulation section 17 demodulates the payload F3 in accordance with the MCS fed back from the header analyzing section 19, thereby acquiring a soft decision value of the payload F3. The thus-obtained soft decision value is input to the LDPC decoding section 18. According to the error correction coding rate fed back from the header analyzing section 19, the LDPC decoding section 18 decodes the soft decision value of the payload F3, outputting an information bit.

In the embodiment, there is used the PHY frame format in which the four header sequences (cs1, cs2, −cs1, and −cs2) that are shown in FIG. 1 and that differ from each other are included in the header F2. An essential requirement is that two or more header sequences should be included in the header F2.

The wireless communication device 10 combines a plurality of header sequences by use of the combining section 15. Accordingly, an SNR of the header is enhanced. Because of enhancement of the SNR of the header, the LDPC decoding section 18 can decode the header at an iterative decoding count that is smaller than a predetermined iterative decoding count. The time involved in decoding the LDPC code of the header can thereby be shortened.

The header analyzing section 19 can acquire the MCS earlier than in the related art. After acquiring the MCS, the header analyzing section 19 feeds the MCS back to the buffer 16, the demodulation section 17, and the LDPC decoding section 18. Demodulation of the payload F3 is initiated in synchronism with feedback timing.

Since the payload F3 is not demodulated until the MCS is acquired, the wireless communication device 10 waits to decode the payload F3 until a head of the payload F3 of the received signal is input to the buffer 16 and until demodulation of the payload F3 is initiated. The signal of the payload F3 received during the wait is temporarily stored and retained in the buffer 16. The wait time which will be consumed by the buffer 16 can be reduced by diminishing the iterative decoding count required for the LDPC decoding section 18 to decode the header. As a result of the wait time being reduced, a memory volume of the buffer 16 can be curtailed.

<Specific Example of Receipt Processing Timing>

By reference to FIGS. 5A and 5B, explanations are given to the fact that the memory volume of the buffer 16 can be curtailed. FIGS. 5A and 5B are timing charts showing a specific example of receipt processing timing of the embodiment. A timing chart shown in FIG. 5A is example operation of the wireless communication device 10. A timing chart shown in FIG. 5B is a comparative example of a case where the LDPC decoding section 18 decodes a header at a predetermined iteration count. In this respect, FIG. 5B is a comparative example for explaining operation (see FIG. 5A) and an advantage of the wireless communication device 10 of the embodiment. The wireless communication device 10 does not operate as shown in FIG. 5B.

Individual sections of the wireless communication device 10 perform processing as follows in each of zones [T1] to [T8] shown in FIGS. 5A and 5B.

[T1] Sync (FIGS. 5A and 5B): The sync section 14 performs sync operation by use of the preamble F1 of the received signal.

[T2] Combining (first, FIGS. 5A and 5B): The combining section 15 combines the first header sequence (cs1) with the second header sequence (cs2) of the header.

[T3] Combining (second, FIGS. 5A and 5B): The combining section 15 combines the third header sequence (−cs1) with the fourth header sequence (−cs2) of the header.

[T4] Decode Header (at a predetermined iteration count, FIG. 5B): The LDPC decoding section 18 decodes the header F2 at a predetermined iteration count. Since the iteration count required for the LDPC decoding section 18 is a predetermined iteration count in zone [T4]; namely, since the iteration count is not curtailed, the time required for the LDPC decoding section 18 to perform decoding becomes longer.

[T5] Buffer Payload (FIGS. 5A and 5B): The buffer 16 temporarily stores the payload F3 of the received signal (buffering) after the combining section 15 performs second combining operation. Buffering is continuously practiced until the buffer 16 acquires the MCS from the header analyzing section 19.

[T6] Decode Header (reduce an iteration count, FIG. 5A): The LDPC decoding section 18 decodes the header F2 by means of iterative decoding. An iteration count required for the LDPC decoding section 18 in zone [T6] becomes smaller than the predetermined iteration count because the SNR of the header F2 is enhanced as a result of the header F2 being combined by the combining section 15.

Specifically, time which elapses before completion of decoding operation is curtailed, so that buffering the payload in the buffer 16 also ends within a short period of time. Accordingly, the memory volume of the buffer 16 is curtailed.

[T7], [T8] Demodulate and Decode Payload (T7 is shown in FIG. 5A, and T8 is shown in FIG. 5B): According to the MCS acquired by the header analyzing section 19, the demodulation section 17 demodulates the payload F3 output from the buffer 16, and the LDPC decoding section 18 decodes a demodulation result (a soft decision value).

To be specific, the wireless communication device 10 shown in FIG. 2 can shorten a time length of the zone [T6] shown in FIG. 5A with reference to a time length of the zone [T4] shown in FIG. 5B because the iteration count required to decode the header F2 is reduced. Therefore, the time required for the buffer 16 to buffer the payload can be shortened in the zone [T5] shown in FIG. 5A, so that the volume of the buffer 16 can be reduced.

<Modification>

Figure 4:
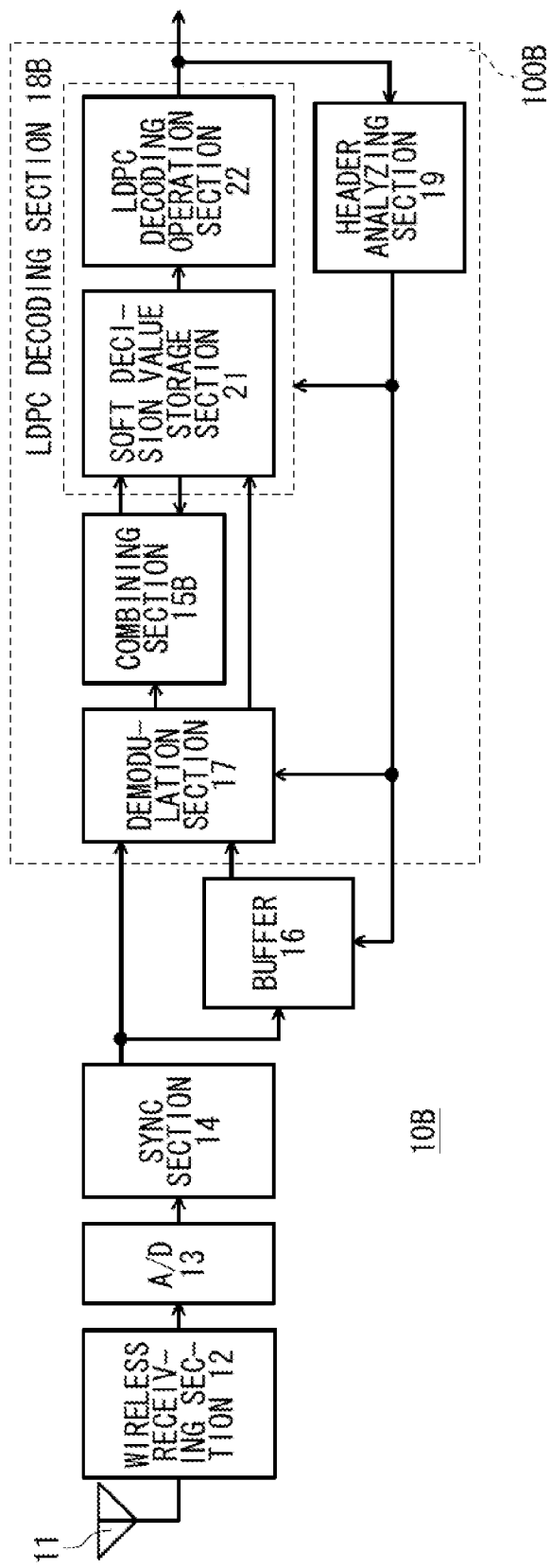
FIG. 4 is a block diagram showing a modification of the wireless communication device shown in FIG. 2.

Explanations are now given to a modification for further curtailing the memory volume of the buffer of the wireless communication device 10. FIG. 4 shows a configuration of a wireless communication device 10B of a modification. In the modification, the memory volume used for combining the plurality of header sequences can be curtailed. In FIG. 4, the elements identical with those show in FIG. 2 are assigned the same reference numerals, and their explanations are omitted.

In FIG. 4, a wait time control section 100B in the wireless communication device 10B differs in terms of a configuration from the wait time control section 100 shown in FIG. 2. The wait time control section 100B includes the demodulation section 17, a combining section 15B, an LDPC decoding section 18B, and the header analyzing section 19. The LDPC decoding section 18B includes a soft decision value storage section 21 and an LDPC decoding operation section 22. The combining section 15B is connected to a juncture between an output of the demodulation section 17 and an input of the LDPC decoding section 18B.

In the modification, an unillustrated transmitter sends a signal as follows. Specifically, the transmitter subjects the header to BPSK modulation or π/2-shift BPSK modulation (hereinafter described as "π/2-BPSK") in which signal points of a BPSK signal are rotated by a phase of π/2 on a per-symbol basis.

The wireless communication device 10B shown in FIG. 4 receives a signal (a PHY frame) transmitted from the transmitter according to the π/2-shift BPSK modulation method.

The wireless receiving section 12, the A/D conversion section 13, and the sync section 14 which are shown in FIG. 4 are analogous, in terms of operation, to their counterparts in the wireless communication device 10 shown in FIG. 2, and hence their explanations are omitted. When the header F2 is modulated according to the π/2-shift BPSK modulation method, the sync section 14 imparts phase rotation of −π/2 to the received signal on a per-symbol basis. Signal points output from the sync section 14 thereby become tantamount to signal points obtained through BPSK modulation.

The demodulation section 17 demodulates the signal output from the sync section 14, outputting to the combining section 15B a soft decision value which corresponds to a demodulation result. The combining section 15B outputs a soft decision value of the first header sequence (cs1) to the LDPC decoding section 18B. The soft decision value storage section 21 in the LDPC decoding section 18B stores the soft decision value of the first header sequence output from the combining section 15B.

When the demodulation section 17 inputs a soft decision value of the second header sequence (cs2) to the combining section 15B, the combining section 15B reads the soft decision value of the first header sequence from the soft decision value storage section 21, combining the soft decision value of the first header sequence with the soft decision value of the second header sequence with each other. The combining section 15B outputs the thus-combined soft decision values to the soft decision value storage section 21. The soft decision value storage section 21 stores the input soft decision values.

From this point onward, likewise, when the demodulation section 17 inputs the third header sequence (−cs1) and the fourth header sequence (−cs2) to the combining section 15B, the combining section 15B reads from the soft decision value storage section 21 soft decision values that are formed by combination of the header sequences, combining the soft decision values of the third header sequence and the fourth header sequence with each other. The combining section 15B outputs the thus-combined soft decision values to the soft decision value storage section 21, and the soft decision value storage section 21 stores the thus-input soft decision values.

The soft decision value storage section 21 is a memory element (memory) used for iteratively reading a soft decision value when the LDPC decoding section 18B decodes an LDPC code by means of repetitive processing operation. The LDPC decoding section 18B performs row processing and column processing pertinent to LDPC decoding in the LDPC decoding operation section 22. The LDPC decoding operation section 22 reads, as required, a soft decision value from the soft decision value storage section 21 in row processing or column processing.

Operation of the header analyzing section 19 and operation of the buffer 16 shown in FIG. 4 are analogous to those of their counterparts in the wireless communication device 10 shown in FIG. 2, and their explanations are omitted.

Since the wireless communication device 10B receives the plurality of header sequences at different times, the combining section 15B uses memory in combining the plurality of header sequences. Moreover, the LDPC decoding section 18B stores the soft decision values in the memory during iterative decoding operation.

In the wireless communication device 10B shown in FIG. 4, the combining section 15B uses the soft decision value storage section 21 in the LDPC decoding section 18B for storing portions of a plurality of header sequences or a combination result. Specifically, memory is commonly used for combining operation of the combining section 15B and LDPC decoding operation of the LDPC decoding section 18B. Accordingly, the memory volume of the wireless communication device 10B can be curtailed when compared to the volume of its counterpart wireless communication device 10.

In the wireless communication device 10B shown in FIG. 4, the header F2 is subjected to BPSK modulation, and a soft decision value λn is expressed by Mathematical Expression (2), provided that a BPSK modulated signal voltage is yn and that noise power is σ2.

[Mathematical Expression 2]

$$\lambda n = (2 \times yn)/\sigma^2 \qquad (2)$$

Mathematical Expression (2) shows that a result yielded when the BPSK modulated signal is subjected to combination after undergoing soft decision is identical with a result yielded when the BPSK modulated signal is subjected to soft decision after being combined. Accordingly, in the wireless communication device 10B of the modification, common memory can be used for both the combining section 15B and the LDPC decoding section 18B. Incidentally, the wireless communication device 10B shown in FIG. 4 is capable of conforming to IEEE802.11ad communication standards.

<Second Embodiment>

<Brief Overview of the Configuration and Operation of the Wireless Communication Device>

Figure 6:
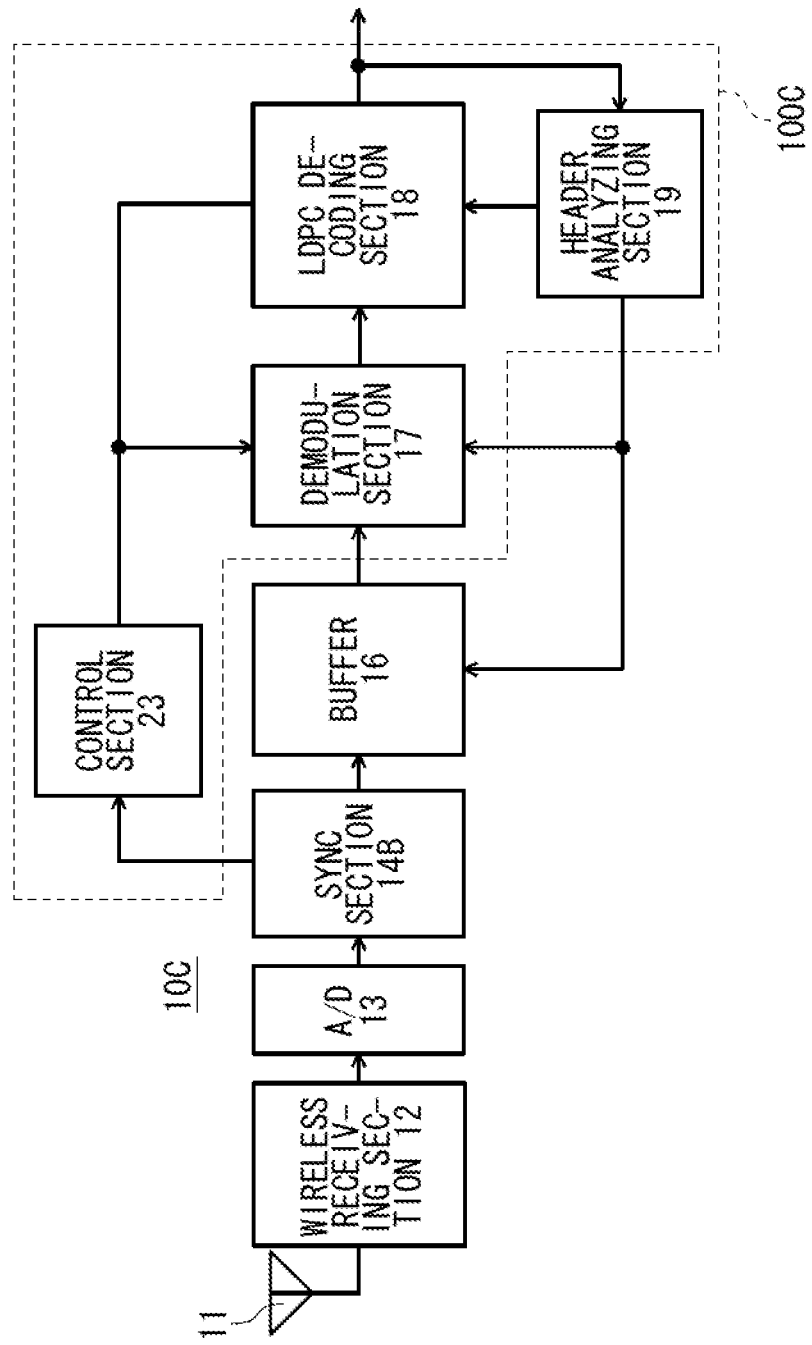
FIG. 6 is a block diagram showing a configuration of a wireless communication device of a second embodiment.

FIG. 6 is a block diagram showing a configuration of a wireless communication device 10C of the embodiment. In the wireless communication device 100 shown in FIG. 6, constituent elements which are tantamount to their counterparts of the wireless communication device 10 shown in FIG. 2 are assigned the same reference numerals, and their explanations are omitted.

The wireless communication device 10C shown in FIG. 6 includes the antenna 11, the wireless receiving section 12, the A/D conversion section 13, a sync section 14B, the buffer 16, and a wait time control section 100C. The wait time control section 1000 includes a control section 23, the demodulation section 17, the LDPC decoding section 18, and the header analyzing section 19.

The antenna 11, the wireless receiving section 12, and the A/D conversion section 13 are analogous, in terms of operation, to the antenna 11, the wireless receiving section 12, and the A/D conversion section 13 of the wireless communication device 10 shown in FIG. 2. The wireless communication device 10C shown in FIG. 6 receives as a received signal a PHY frame having the format shown in FIG. 1.

The sync section 14B shown in FIG. 6 performs frequency synchronization of a carrier wave and synchronization of a sampling clock by use of the preamble F1 of the received signal. In addition, after establishing frame synchronization, the sync section 14B locates a header position in the received PHY frame. The sync section 14B also outputs to the buffer 16 the received signal that has undergone synchronization processing. Further, the sync section 14B outputs to the control section 23 a control signal (hereinafter referred to as a "head position signal") that indicates the thus-located header position.

When the header F2 is input from the sync section 14B, the buffer 16 outputs the header F2 to the demodulation section 17 without buffering it. The control section 23 outputs a control signal (hereinafter referred to as a "header sequence control signal") showing any one of the first header sequence (cs1), the second header sequence (cs2), and the third header sequence (−cs1) by use of the header position signal output from the sync section 14B.

In this respect, the control section 23 can also output a control signal showing any of the first to third header sequences. By way of example, explanations are now given to a case where the control section 23 outputs a header sequence control signal showing the first header sequence that is most effective in reducing the buffer capacity.

The demodulation section 17 selects and demodulates the header sequence represented by the header sequence control signal input from the control section 23. In this respect, the demodulation section 17 does not demodulate a header sequence other than the header sequence represented by the header sequence control signal. The demodulation section 17 outputs to the LDPC decoding section 18 a soft decision value of the demodulated header sequence. The LDPC decoding section 18 performs decoding by use of the input soft decision value, thereby acquiring a header.

The header acquired by the LDPC decoding section 18 is input to the header analyzing section 19. The header analyzing section 19 acquires an MCS from the header and feeds back the thus-acquired MCS to the buffer 16 and the demodulation section 17.

The buffer 16 outputs to the demodulation section 17 the payload signal in synchronism with the timing at which the MCS is fed back. In accordance with the thus-fed-back MCS, the demodulation section 17 outputs to the LDPC decoding section 18 a soft, decision value that is obtained by demodulating the payload. The LDPC decoding section 18 decodes using the soft decision value of the payload that is output by the demodulation section 17. The LDPC decoding section 18 outputs, as a decoding result, an acquired information bit.

In the embodiment, the sync section 14B subjects the frame of the received signal to synchronous processing, locating positions of respective fields in the frame. On the basis of the thus-located header positions, the control section 23 selects which one of the first header sequence to the third header sequence as a target to be demodulated and decoded. Selection made by the control section 23 enables a curtailment of the memory volume required for the buffer 16. Grounds for that are hereunder described.

<Specific Example of Receipt Processing Timing>

Figure 7A:
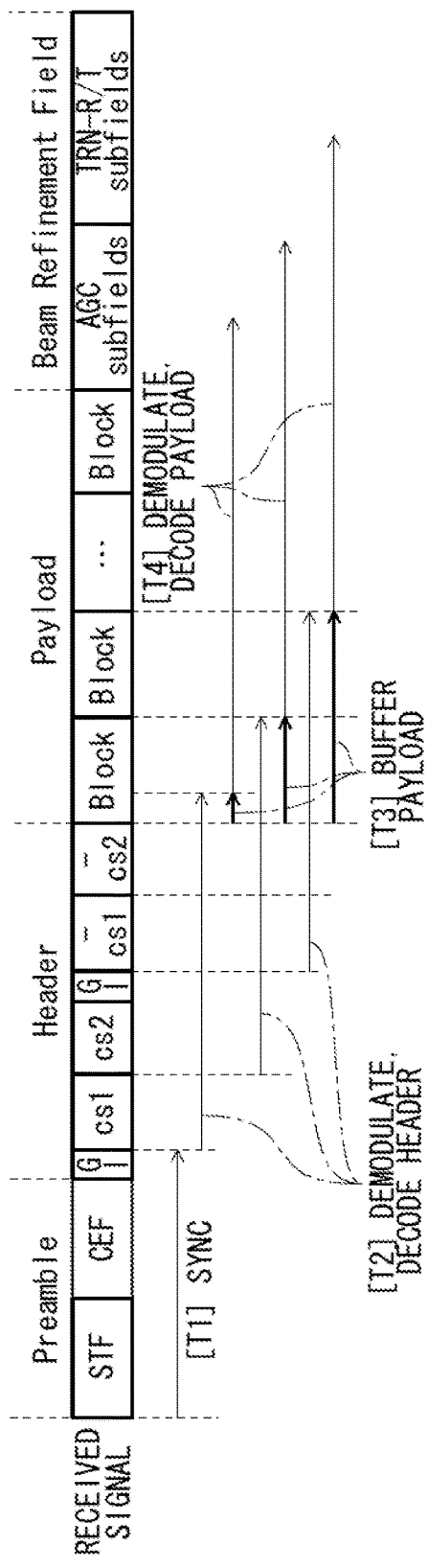
Figure 7B:
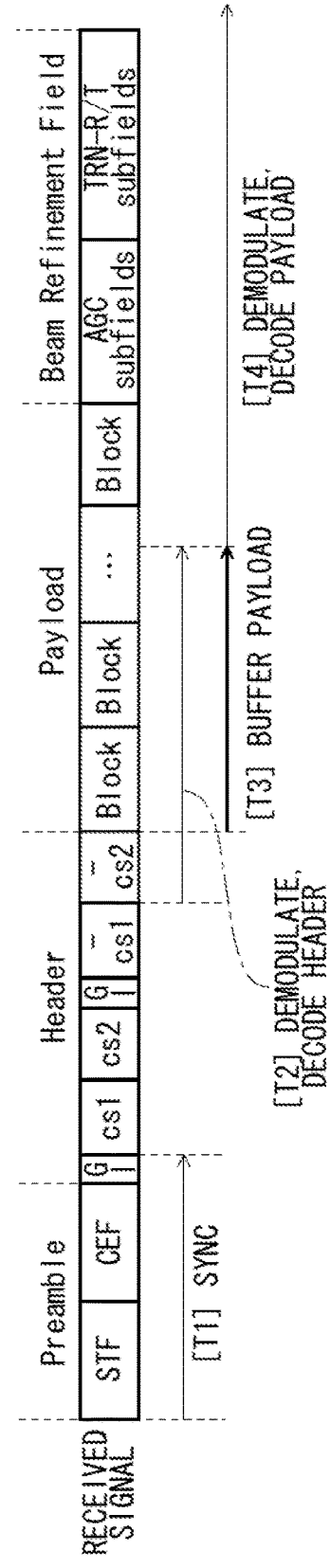

FIGS. 7A and 7B are timing charts of receipt processing of the wireless communication device 100 shown in FIG. 6. A timing chart shown in FIG. 7A shows an example of operation of the wireless communication device 100. A timing chart shown in FIG. 7B shows a comparative example of a case where the payload is demodulated after the header is acquired by demodulating and decoding the final header sequence (−cs2) included in the header F2. FIG. 7B is a comparative example for explaining operation (see FIG. 7A) and an advantage of the wireless communication device 100 of the embodiment, and the wireless communication device 10C does not operate as shown in FIG. 7B.

Individual sections of the wireless communication device 10C perform processing as follows in respective zones [T1] to [T4] shown in FIG. 7.

[T1] Sync (FIGS. 7A and 7B): The sync section 14B performs synchronous processing by use of the preamble F1 of the received signal, thereby locating a header position.

[T2] Demodulate and Decode Header (FIGS. 7A and 7B): The demodulation section 17 demodulates a header, and the LDPC decoding section 18 decodes a result of decoding of the header. FIG. 7A shows timing at which the first to third header sequences (cs1, cs2, and −cs1) are respectively demodulated and decoded. FIG. 7B shows timing at which the fourth header sequence (−cs2) is demodulated and decoded.

[T3] Buffer Payload (FIGS. 7A and 7B): The buffer 16 buffers the payload F3 until the header analyzing section 19 acquires an MCS by means of the LDPC decoding section 18 decoding the header F2.

[T4] Demodulate and Decode Payload (FIGS. 7A and 7B): The demodulation section 17 demodulates the payload F3, and the LDPC decoding section 18 decodes a result of decoding of the payload F3.

In FIG. 7B, when the wireless communication device 100 demodulates and decodes the fourth header sequence (−cs2), timing at which the standby time control section 100C acquires the MCS of the header gets latest. Therefore, a memory volume required to buffer the payload becomes maximum.

In the meantime, in FIG. 7A, when the wireless communication device 100 demodulates and decodes the first header sequence (cs1) from among the first header sequence (cs1) to the third header sequence (−cs1), timing when the standby time control section 100C acquires an MCS of the header becomes latest. Therefore, the memory volume used for buffering the payload becomes minimum.

Accordingly, the wireless communication device 100 demodulates and decodes any one of the header sequences other than the final fourth header sequence (−cs2), thereby acquiring an MCS. When the payload F3 is demodulated and decode by use of the MCS, the memory volume of the buffer 16 used for buffering the payload F3 can be curtailed.

<Third Embodiment>

<Brief Overview of the Configuration and Operation of the Wireless Communication Device>

Figure 8:
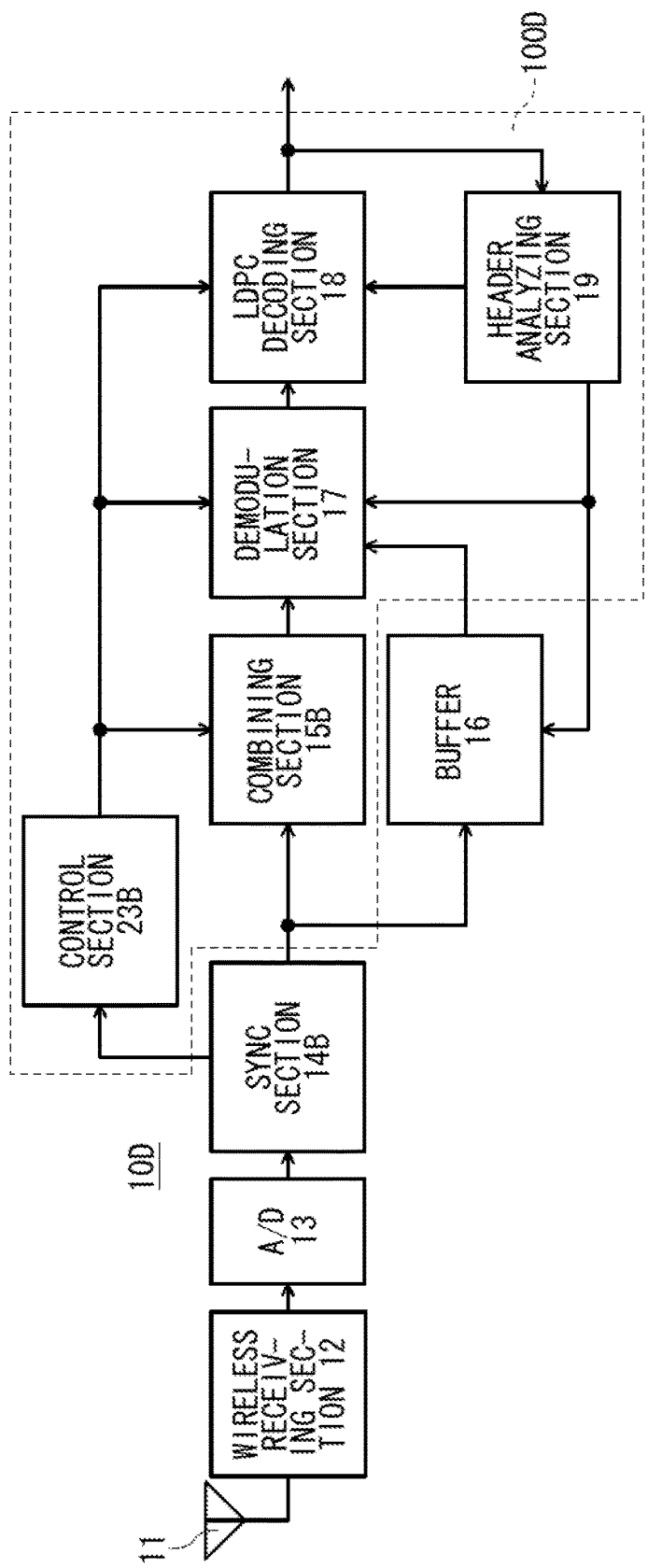
FIG. 8 is a block diagram showing a configuration of a wireless communication device of a third embodiment.

FIG. 8 is a block diagram showing a configuration of a wireless communication device 10D of the embodiment. In the wireless communication device 10D shown in FIG. 8, constituent elements that are identical with their counterparts shown in FIG. 2 or FIG. 6 are assigned the same reference numerals, and their explanations are omitted.

The wireless communication device 10D shown in FIG. 8 includes the antenna 11, the wireless receiving section 12, the A/D conversion section 13, the sync section 14B, the buffer 16, and a wait time control section 100D. The wait time control section 100D includes a control section 23B, the combining section 15B, the demodulation section 17, the LDPC decoding section 18, and the header analyzing section 19.

The antenna 11, the wireless receiving section 12, and the A/D conversion section 13 are analogous, in terms of operation, to the antenna 11, the wireless receiving section 12, and the A/D conversion section 13 of the wireless communication device 10 shown in FIG. 2. The wireless communication device 10D shown in FIG. 8 receives as a received signal the PHY frame having the format shown in FIG. 1.

The sync section 14B shown in FIG. 8 performs frequency synchronization of the carrier wave and synchronization of the sampling clock by use of the preamble F1 of the received signal. Further, after establishing frame synchronization, the sync section 14B locates a header position in the received PHY frame. The sync section 14B also outputs to the buffer 16 the received signal subjected to synchronization processing. Further, the sync section 148 outputs the header position signal to the control section 23.

The control section 23 outputs a control signal (hereinafter referred to as a "header sequence combination signal") showing a combination of two or more of the first to third header sequences (cs1, cs2, and −cs1).

The combining section 15B combines, among the headers output from the sync section 14B, a plurality of header sequences specified by the header sequence combination signal output from the control section 23B, outputting a combination result to the demodulation section 17.

The demodulation section 17 calculates soft decision values by use of the combined header sequences output from the combining section 15B, outputting the soft decision values to the LDPC decoding section 18. The LDPC decoding section 18 decodes the header by performing iterative decoding at a count that is smaller than the predetermined iteration count. The LDPC decoding section 18 outputs a header obtained by decoding to the header analyzing section 19. The header analyzing section 19 acquires an MCS from the header. After acquiring the MCS, the header analyzing section 19 feeds back the MCS to the buffer 16, the demodulation section 17, and the LDPC decoding section 18.

In synchronism with timing at which the header analyzing section 19 feeds back the MCS, the demodulation section 17 reads the payload from the buffer 16, demodulates the thus-read payload, and calculates a soft decision value of the payload. Moreover, the LDPC decoding section 18 decodes the payload on the basis of the soft decision value of the payload output from the demodulation section 17. Demodulation and decoding are analogous to those described in connection with the first embodiment, and hence their explanations are omitted here.

In the embodiment, the combining section 15B selects a combination of two or more header sequences from among a plurality of header sequences to be combined; namely, a plurality of header sequences except the last header sequence (−cs2), in accordance with the header sequence combination signal output from the control section 23B. The combining section 15B combines the plurality of header sequences selected as a combination. The SNR of the header sequence can thereby be enhanced. Accordingly, when decoding the LDPC code of the header, the LDPC decoding section 18 can curtail an iteration count. Time which elapses before header information is acquired by means of decoding operation of the LDPC decoding section 18 can be shortened.

Further, since a combination is selected from among the plurality of header sequences except the last header sequence, compared to a case where the last header sequence (−cs2) is decoded, demodulation and decoding of the header can be completed early. Specifically, header decoding can be completed early, and wait time which elapses before demodulation and decoding of the payload is commenced can be shortened. The wireless communication device 10D can thereby curtail the memory volume of the buffer 16 used in buffering the payload.

<Specific Example of Receipt Processing Timing>

FIGS. 9A and 9B are timing charts of receipt processing of the wireless communication device 10D shown in FIG. 8. A timing chart shown in FIG. 9A is an example of operation of the wireless communication device 10D. A timing chart shown in FIG. 9B shows a comparative example in which a predetermined iteration count is applied to decoding the header F2. FIG. 9B is a comparative example for explaining operation (see FIG. 9A) and an advantage of the wireless communication device 10D of the embodiment, and the wireless communication device 10D does not operate as shown in FIG. 9B.

Individual sections of the wireless communication device 10D perform processing in the respective zones [T1] to [T7] shown in FIG. 9 as follows:

[T1] Sync (FIGS. 9A and 9B): The sync section 14B performs synchronous processing by use of the preamble F1 of a received signal.

[T2] Combining (FIGS. 9A and 9B): The combining section 15B combines a plurality of header sequences selected from among the plurality of header sequences except the last header sequence.

[T3] Decode Header (Reduce iteration count, FIG. 9A): The LDPC decoding section 18 decodes the header F2 by means of iterative decoding. Since the combining section 15B combines the plurality of header sequences of the header F2, the SNR of the header F2 is enhanced, so that an iteration count employed by the LDPC decoding section 18 in the zone T3 becomes smaller than the predetermined iteration count.

Specifically, time which elapses before completion of decoding is shortened, and buffering the payload in the buffer 16 ends in a short time. Hence, the memory volume used by the buffer 16 is curtailed.

[T4] Demodulate and Decode Payload (FIGS. 9A and 9B): The demodulation section 17 demodulates the payload in accordance with the MCS acquired from the header analyzing section 19. The LDPC decoding section 18 decodes a result of demodulation of the payload.

Buffer Payload (FIGS. 9A and 9B): The buffer 16 buffers the payload until the header analyzing section 19 acquires the MCS by means of decoding the header.

[T6] Decode Header (Predetermined Iteration Count, FIG. 9B): The LDPC decoding section 18 decodes the header F2 by means of performing iterative processing at a predetermined iteration count.

[T7] (Reduce Buffer Capacity): Time of the zone [T6] is shortened by an amount commensurate with the reduction in the time of the zone [T3]. The memory volume used by the buffer 16 can be curtailed according to the reduction in time. Specifically, the wireless communication device 10D shown in FIG. 8 can curtail the volume of the buffer 16.

<Fourth Embodiment>

<Brief Overview of the Configuration and Operation of a Wireless Communication Device>

A wireless communication device of the embodiment diminishes the probability of occurrence of an error in header decoding even when the SNR of the received signal is low, and buffer capacity of the payload is curtailed by completing header decoding early.

Figure 10:
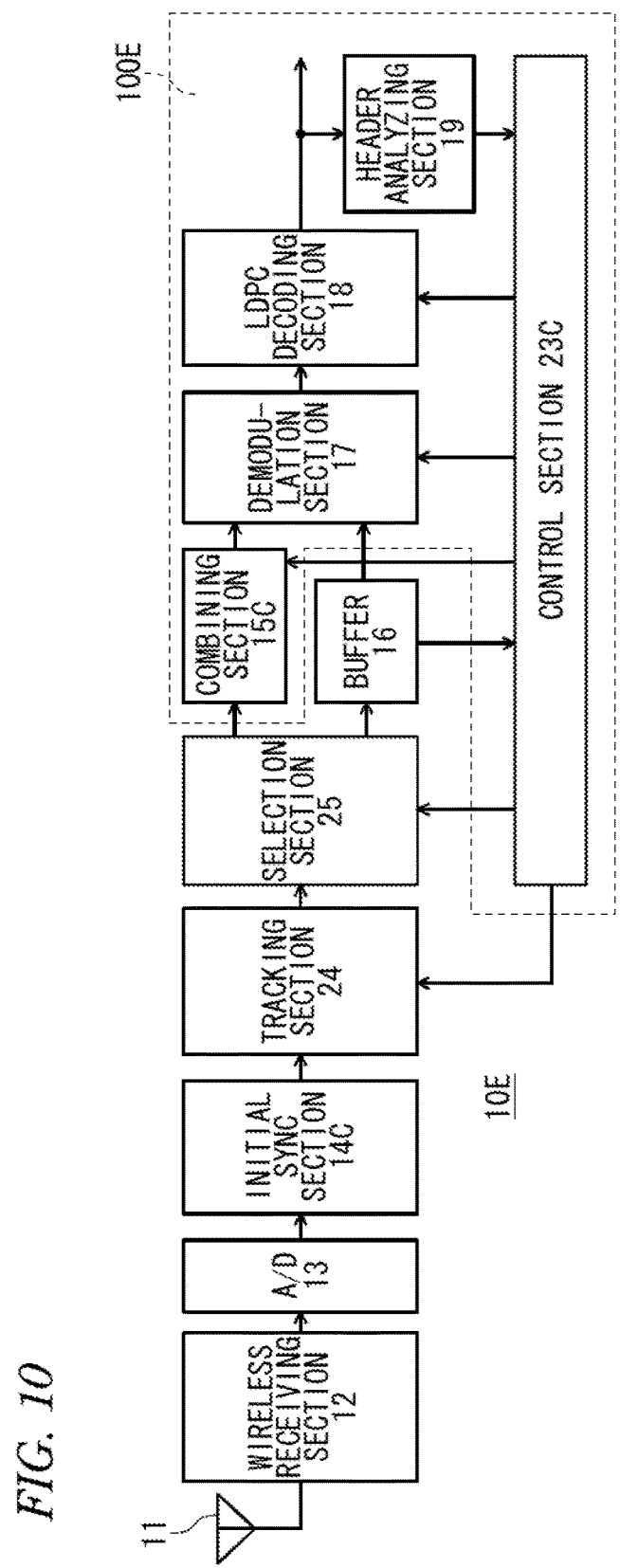
FIG. 10 is a block diagram showing a configuration of a wireless communication device of a fourth embodiment.

FIG. 10 is a block diagram showing a configuration of a wireless communication device 10E. In the wireless communication device 10E shown in FIG. 10, constituent elements that are identical with their counterparts of the embodiments are assigned the same reference numerals, and their explanations are omitted.

The wireless communication device 10E shown in FIG. 10 includes the antenna 11, the wireless receiving section 12, the A/D conversion section 13, an initial sync section 14C, a tracking section 24, a selection section 25, the buffer 16, and a wait time control section 100E. The wait time control section 100E includes a combining section 15C, the demodulation section 17, the LDPC decoding section 18, and the header analyzing section 19.

The antenna 11, the wireless receiving section 12, and the A/D conversion section 13 are analogous, in terms of operation, to the antenna 11, the wireless receiving section 12, and the A/D conversion section 13 of the wireless communication device 10 shown in FIG. 2. The wireless communication device 10E shown in FIG. 10 receives as a received signal the PHY frame having the format shown in FIG. 1.

The initial sync section 14C performs initial synchronization of frequency drifts in a carrier wave and the sampling clock that are exchanged between the transmitter and the receiver using the preamble F1 of the received signal. The initial sync section 14C outputs to the tracking section 24 a signal that has finished undergoing initial synchronization.

Even when subjected to initial synchronization, a received signal tends to gradually go out of synchronization for various factors. For this reason, the wireless communication device 10E performs synchronous tracking called tracking in order to maintain a proper synchronous state between the receiver and the transmitter. In the wireless communication device 10E shown in FIG. 10, the tracking section 24 performs tracking operation.

In reality, GI that is a known signal sequence shown in FIG. 1 is included in a boundary location between fields of the received signal. Consequently, the tracking section 24 performs tracking by use of the known signal sequence GI included in the received signal.

The tracking section 24 outputs to the selection section 25 the received signal that has finished undergoing tracking. The selection section 25 outputs the received signal to the combining section 15C or the buffer 16 under control of the control section 23C. Details of control performed by the control section 23C will be described later.

The combining section 15C has two combining functions. A first combining function of the combining section 15C is a function of combining the plurality of header sequences "cs1" and "cs2" in the first header block F21. A second combining function of the combining section 15C is a function of combining the plurality of header sequences "–cs1" and "–cs2" in the second header block F22. The combining section 15C outputs the thus-combined headers to the demodulation section 17.

The buffer 16 buffers the payload until the MCS is acquired. The demodulation section 17 subjects the received signal to soft decision and outputs a soft decision value, which is calculated as a result of soft decision, to the LDPC decoding section 18. The LDPC decoding section 18 decodes the header F2 and the payload F3 on the basis of the soft decision value output from the demodulation section 17.

The header analyzing section 19 analyzes header information obtained by means of decoding operation of the LDPC decoding section 18, outputting an analysis result of the control section 23C. Analyzing header information includes a function of detecting an error in header information. The function of detecting an error in header information is implemented by use of; for instance, a function of subjecting header information to CRC (Cyclic Redundancy Check) coding or a function of checking a parity of an LDPC code.

The control section 23C controls the selection section 25, the combining section 15C, the buffer 16, the demodulation section 17, and the LDPC decoding section 18 by use of a result of analysis of the header information.

<Specific Example of Receipt Processing Timing>

Figure 11:
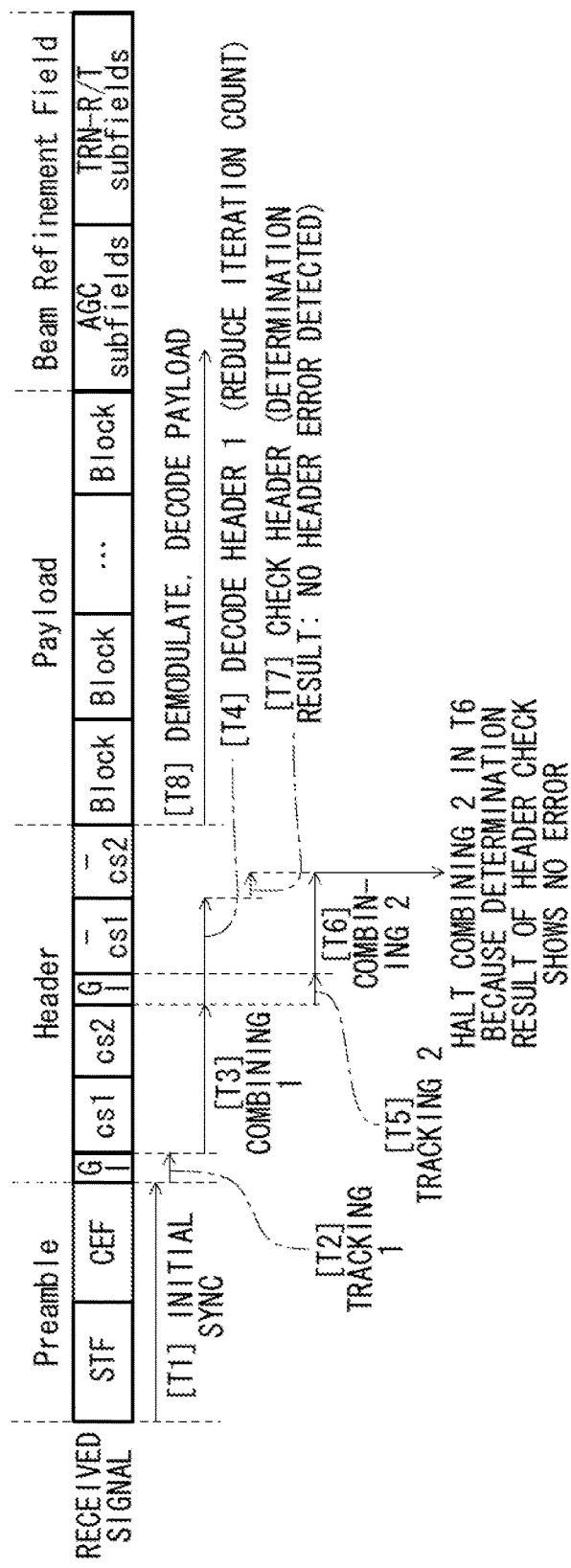
FIG. 11 is a timing chart showing a specific example of receipt processing timing of the wireless communication device shown in FIG. 10.
Figure 12:
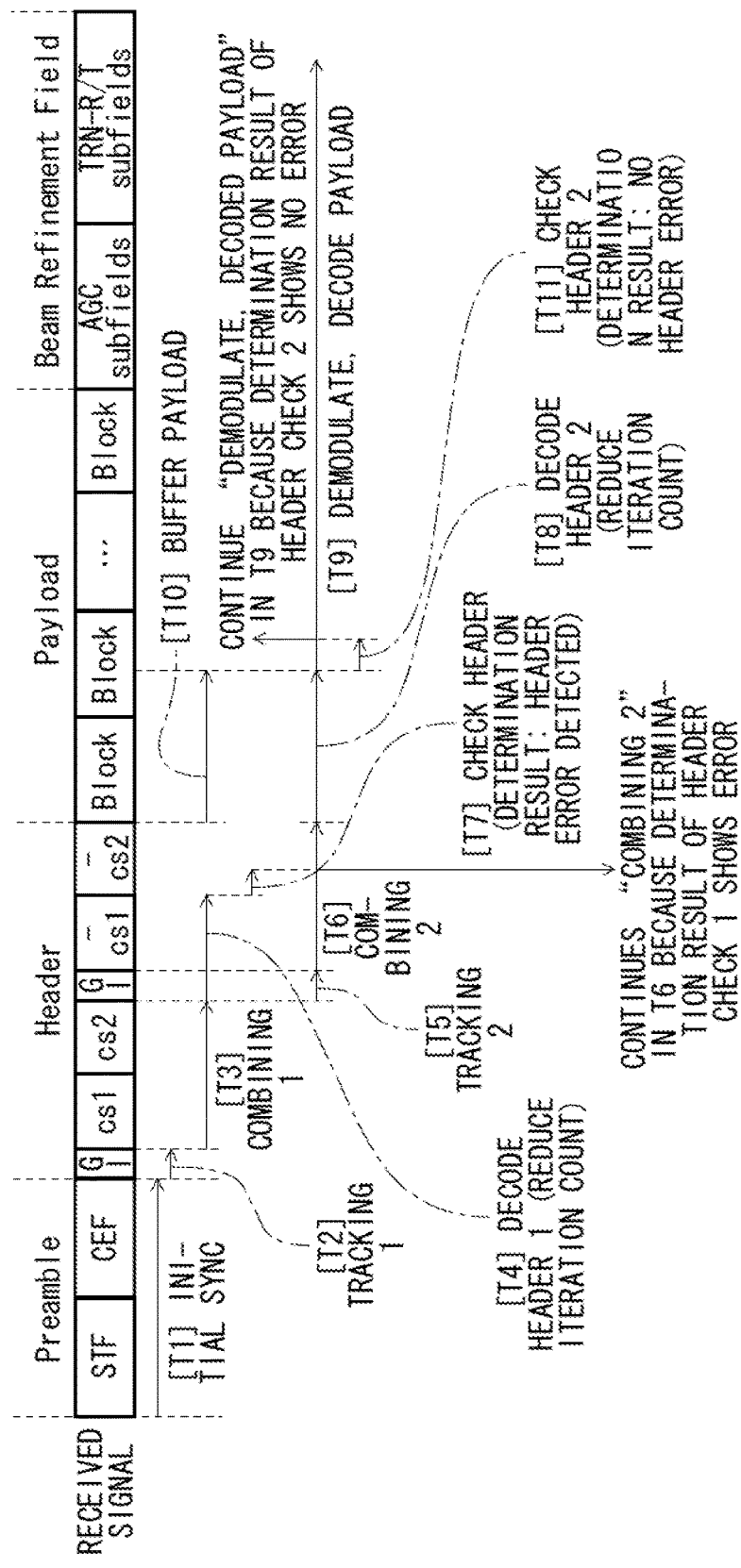
FIG. 12 is a timing chart showing a specific example of receipt processing timing of the wireless communication device shown in FIG. 10.
Figure 13:
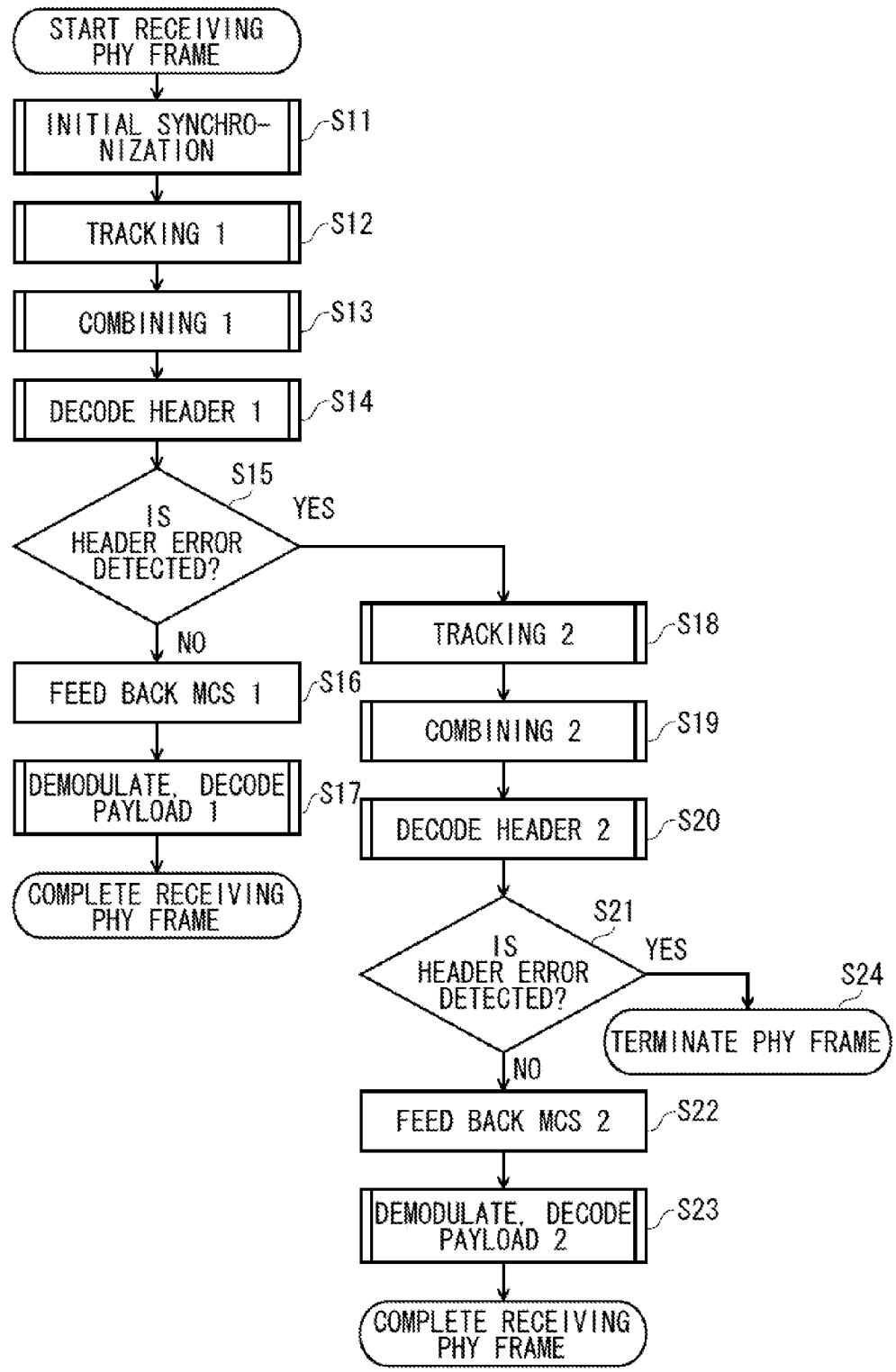
FIG. 13 is a flowchart showing receipt processing procedures of the wireless communication device shown in FIG. 10.

FIG. 11 and FIG. 12 show timing charts that represent receipt processing of the wireless communication device 10E shown in FIG. 10. FIG. 13 is a flowchart showing receipt processing procedures of the wireless communication device 10E shown in FIG. 10.

<Explanations about Operations Shown in FIG. 11 and FIG. 13>

FIG. 11 shows an example of operation of the wireless communication device 10E performed when a header error is not detected as a result of the header being decoded by use of the first header block F21. Explanations are given by reference to FIG. 13 when necessary.

Individual sections of the wireless communication device 10E perform processing in respective zones [T1] to [T8] shown in FIG. 11 as follows.

[T1] Initial Sync: The initial sync section 14C performs initial synchronization by use of the preamble F1 (S11).

[T2] Tracking 1: The tracking section 24 performs tracking operation by use of the known signal sequence 'GI' in the first header block F21 (S12).

[T3] Combining 1: The combining section 15C combines the plurality of header sequences (cs1, cs2) within the first header block F21 (S13).

[T4] Decode Header 1: The demodulating section 17 demodulates the header F2 by use of a combination result of the plurality of header sequences in the first header block F21. The LDPC decoding section 18 decodes a demodulation result of the header F2 (S14).

[T5] Tracking 2: The tracking section 24 performs tracking by use of "GI" that is a known signal sequence in the second header block F22 (S18).

[T6] Combining 2: The combining section 15C combines the plurality of header sequences (–cs1 and –cs2) in the second header block F22 (S19).

[T7] Check Header: The header analyzing section 19 detects an error in header information acquired by decoding the header F2 in the zone [T4] (S15). FIG. 11 shows a premise that an error in the header will not be detected in the zone [T7] (NO in S15). Therefore, the control section 23C causes the combining section 15C to halt operation of "Combining 2" in zone [T6] according to an error detection result generated in the zone [T7].

[T8] Demodulate and Decode Payload: The demodulation section 17 demodulates a payload in accordance with the MCS included in the header information acquired by the header analyzing section 19 (S16). The LDPC decoding section 18 decodes a result of demodulation of the payload. Decoding the payload F3 is thus completed (S17).

In FIG. 11, the control section 23C causes the selection section 25 to select the header sequences "cs1" and "cs2" of the first header block within the zone [T3], further causing the combining section 15C to combine the header sequences "cs1" and "cs2" of the first header block.

In the zone [T4], the control section 23C causes the demodulation section 17 to demodulate a signal that results from combination of the header sequences of the first header block, causing the LDPC decoding section 18 to LDPC-decode a demodulation result.

Concurrently with a control pertinent to the zone [T4], the control section 23C starts performing a control pertinent to the zone [T5] and a control pertinent to the zone [T6]. Specifically, the control section 23C causes the tracking section 24 to start tracking the second header block in the zone [T5], causes the selection section 25 to select the header sequences "−cs1" and "−cs2" of the second header block in zone [T6], and further causes the combining section 15C to combine the header sequences "−cs1" and "−cs2" of the second header block.

In the meantime, when the header analyzing section 19 did not detect any error in the header information resultant of LDPC decoding of the first header block, the control section 23C causes the combining section 15C to halt combining operation in the zone [T6].

In accordance with the MCS obtained after halting of combining operation, the control section 23C causes the demodulation section 17 and the LDPC decoding section 18 to demodulate and decode the payload F3 in the zone [T8].

<Explanations about Operation in FIG. 12 and FIG. 13>

FIG. 12 shows an example of operation of the wireless communication device 10E performed when an error in a header is detected as a result of the header being decoded by use of the first header block F21. Explanations are provided, as necessary, by reference to FIG. 13.

Individual sections of the wireless communication device 10E perform processing in respective zones [T1] to [T11] shown in FIG. 12 as follows.

[T1] Initial Sync: The initial sync section 14C performs initial synchronization by use of the preamble F1 (S11).

[T2] Tracking 1: The tracking section 24 performs tracking operation by use of the known signal sequence "GI" in the first header block F21 (S12).

[T3] Combining 1: The combining section 15C combines a plurality of header sequences (cs1, cs2) within the first header block F21 (S13).

[T4] Decode Header 1: The demodulating section 17 demodulates the header F2 by use of a result of combination of the plurality of header sequences in the first header block F21. The LDPC decoding section 18 decodes a result of demodulation of the header F2 (S14).

[T5] Tracking 2: The tracking section 24 performs tracking by use of the "GI" that is a known signal sequence in the second header block F22 (S18).

[T6] Combining 2: The combining section 15C combines the plurality of header sequences (−cs1 and −cs2) in the second header block F22 (S19).

[T7] Check Header 1: The header analyzing section 19 detects an error in header information acquired by decoding the header F2 in the zone [T4] (S15). FIG. 12 shows a premise that an error in the header will be detected in the zone [T7] (YES in S15). Therefore, the control section 23C causes the combining section 15C to continue performing operation of "Combining 2" in the zone [T6] according to a result of error detection performed in the zone [T7].

[T8] Decode Header 2: The demodulating section 17 demodulates the header F2 by use of a result of combination of the plurality of header sequences in the second header block F22. The LDPC decoding section 18 decodes a result of demodulation of the header F2 (S20).

[T9] Demodulate and Decode Payload: The demodulation section 17 demodulates the payload F3 in accordance with the MCS included in the header information acquired by the header analyzing section 19 (S22). The LDPC decoding section 18 decodes a result of demodulation of the payload F3 (S23).

[T10] Buffer Payload: The buffer 16 buffers the payload F3 of the received signal until the MCS is fed back as a decoding result from the control section 23C in the zone [T8].

[T11] Check Header 2: The header analyzing section 19 detects an error in the header information obtained by decoding the header F2 in the zone [T8] (S21).

In FIG. 12, the control section 23C causes the selection section 25 to select the header sequences "cs1" and "cs2" of the first header block in the zone [T3], further causing the combining section 15C to combine the header sequences "cs1" and "cs2" of the first header block.

In the zone [T4], the control section 23C next causes the demodulation section 17 to demodulate a signal obtained as a result of combination of the first header block, causing the LDPC decoding section 18 to subject a demodulation result to LDPC decoding.

Next, concurrently with a control pertinent to the zone [T4], the control section 23C starts performing a control pertinent to the zone [T5] and a control pertinent to the zone [T6]. Specifically, the control section 23C causes the tracking section 24 to start tracking the second header block in the zone [T8], causing the selection section 25 to select the header sequences "−cs1" and "−cs2" of the second header block in the zone [T8], and causing the combining section 15C to combine the header sequences "−cs1" and "−cs2" of the second header block.

In the meantime, when the header analyzing section 19 detects an error in header information obtained as a result of the first header block being LDPC-decoded, the control section 23C causes the combining section 15C to continue performing combining operation in the zone [T6]. Further, the control section 23C causes the demodulation section 17 to demodulate the combined header F2 in the zone [T8] by use of a combination result yielded in the zone [T6], further causing the LDPC decoding section 18 to decode a soft decision value serving as a demodulation result.

When the header analyzing section 19 did not detect any error in the header from the result of decoding of the header in the zone [T8], the control section 23C temporarily stores the payload F3 in the buffer 16, causing the demodulation section 17 and the LDPC decoding section 18 to demodulate and decode the payload F3.

In the meantime, provided that an error in the header is detected in connection with [Header Check 2] in the zone [T11], the control section 23C will cause the demodulation section 17 and the LDPC decoding section 18 to stop demodulating and decoding the payload (S24).

In the embodiment, when the wireless communication device 10E serving as a receiver performs tracking by use of the known signal "GI," variations will occur in tracking performance on a per-GI-signal basis when the SNR of the received signal is low. Variations in tracking performance specifically represent phenomena to be described below.

First, when the tracking section 24 performs tracking by use of the "GI" sequence of the first header block (hereinafter called a "first known sequence"), the frequency of the carrier wave of the receiver and the frequency of the sampling clock go in synchronization with each other. In the meantime, when the SNR of the received signal is low during the course of the tracking section 24 performing tracking operation by use of the "GI" sequence of the second header block (hereinafter called a "second known sequence"), a loss of synchronization occurs.

Alternatively, even if a loss of synchronization occurs when the tracking section 24 performs tracking by use of the first known sequence, synchronization may occur when tracking is performed by use of the second known sequence. Thus, when the SNR is low, synchronization may be achieved or a loss of synchronization may occur depending on the GI used for tracking.

In light of such a situation, the wireless communication device 10E shown in FIG. 10 can combine the first header sequence (cs1) subjected to tracking by use of the first known sequence with the second header sequence (cs2), without being affected by tracking operation that uses the second known sequence.

In the meantime, the third header sequence (−cs1) and the fourth header sequence (−cs2) are header sequences that subjected to tracking using the second known sequence. Accordingly, combining the third header sequence with the fourth header sequence becomes less susceptible to influence of tracking that uses the first known sequence.

By means of combination of the header blocks mentioned above, the wireless communication device 10E becomes able to perform combining operation that is less susceptible to influence of variations in tracking performance. Consequently, separately performing LDPC decoding that uses a result of combination of the first header block and LDPC decoding that uses a result of combination of the second header block results in smaller possibility of occurrence of an error in a result of decoding of the header.

The LDPC decoding section 18 can make the iteration count required to decode the header smaller than the predetermined iteration count by means of an improvement in the SNR of the header achieved through combination. A decoding time required to decode a header by use of each result of header block combination is thereby shortened. By means of a reduction in decoding time, the memory volume of the buffer 16 used for storing a payload in the receiver can be diminished.

When a header error is not detected during decoding operation that uses the first header block, the wireless communication device 10E stops demodulating and decoding the second header block. In a comparatively superior receiving environment, there is also yielded an advantage of power involved in receiving operation being averagely reduced.

<Explanations about the Modification>

When the received signal is tracked, tracking using the known sequence "GI" is frequently performed as does the tracking section 24 shown in FIG. 10.

Meanwhile, in addition to tracking control using a known signal, synchronization control using a modified costas (Modified Costas, Hard-Limited Costas), synchronization control using a hard decision "Decision-Feedback-Equalizer", or a blind equalization method; for instance, has also been known. These control operations belong to a method for subjecting an unknown information signal to synchronization and equalization (hereinafter called a "decision feedback control").

Applying decision feedback control to; for instance, control of the tracking section 24, is also conceivable. However, in a circumstance where a modulation method used for a payload is unknown, decision feedback control encounters a problem of deterioration of sync performance or equalization performance.

Accordingly, in order to prevent deterioration of sync performance, which would otherwise occur when decision feedback control is used for tracking control, a payload is buffered until an MCS becomes clear when a payload is subjected to synchronous processing. However, when the payload is buffered until the MCS becomes clear, an increase in memory volume used by the buffer 16 is inevitable.

Figure 14:
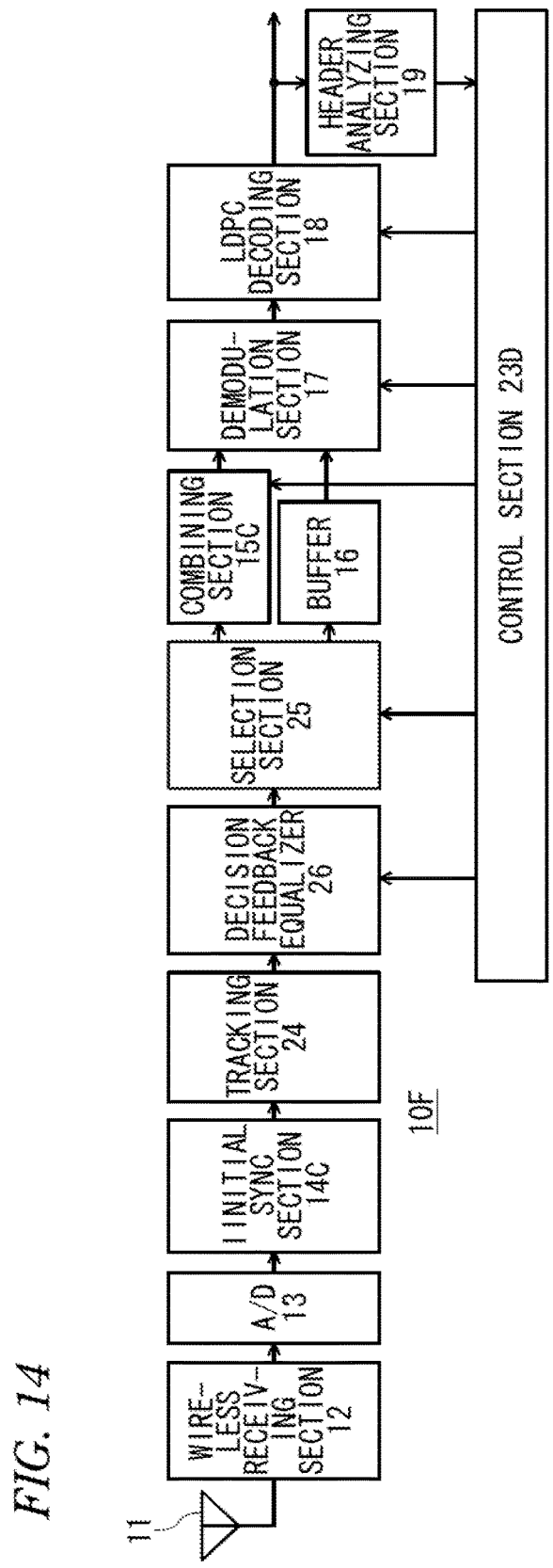
FIG. 14 is a block diagram showing a configuration of modification (1) of the wireless communication device shown in FIG. 10.
Figure 15:
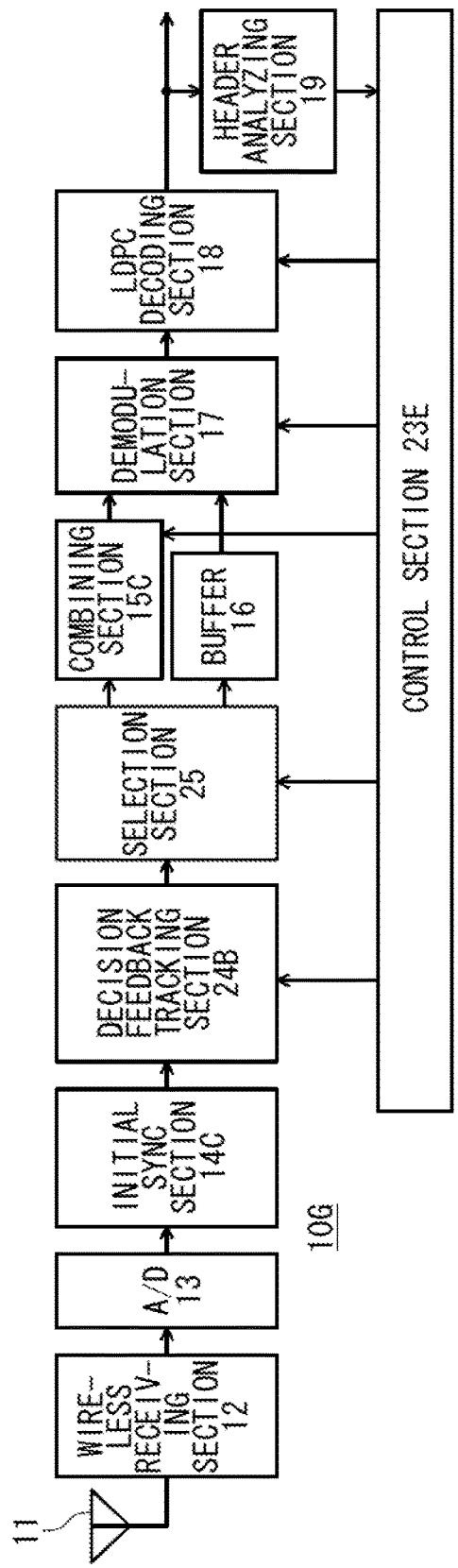
FIG. 15 is a block diagram showing a configuration of modification (2) of the wireless communication device shown in FIG. 10.

FIG. 14 shows an internal configuration of a wireless communication device 10F adopting decision feedback control as a modification of the wireless communication device 10E shown in FIG. 10, and FIG. 15 shows an internal configuration of a wireless communication device 10G adopting the same control.

<Explanations about the Wireless Communication Device 10F Shown in FIG. 14>

In the wireless communication device 10F shown in FIG. 14, a decision feedback equalizer 26 is connected to a junction between an output of the tracking section 24 and an input of the selection section 25. In other respects, the configuration of the wireless communication device 10F is identical with the configuration of the wireless communication 10E shown in FIG. 10, and hence their explanations are omitted.

The decision feedback equalizer 26 is an equalizer that adopts decision feedback control. Specifically, the decision feedback equalizer 26 estimates a state of propagation of a transmission path between the transmitter and the wireless communication device 10F, eliminates distortion of a received signal occurred in the transmission path, and restores the same signal as that transmitted from the transmitter. Further, the decision feedback equalizer 26 performs control so as to detect and make smaller a control error by feeding back an output to its input side. In this regard, since the received signal is processed as an unknown signal, equalization performance will become deteriorated in a situation where a method for modulating a payload is unknown.

For this reason, the wireless communication device 10F shown in FIG. 14 performs control operation such that the control section 23D gives an MCS, which is produced by decoding the header F2 in the header analyzing section 19, to the decision feedback equalizer 26. The decision feedback equalizer 26 can ascertain the method for modulating a payload from the MCS input from the control section 23D. A control error occurring in the decision feedback equalizer 23 is thereby diminished, so that deterioration of equalization performance is prevented.

The wireless communication device 10F shortens time used in decoding the header by the LDPC decoding section 18 when compared with that used in the related art. Accordingly, the header analyzing section 19 can feed back the MCS to the decision feedback equalizer 26 in an early stage of receipt processing of the payload of the received signal. Deterioration of equalization performance can thereby be inhibited.

<Explanations about the Wireless Communication Device 10G Shown in FIG. 15>

The wireless communication device 10G shown in FIG. 15 is provided with a decision feedback tracking section 24B in place of the tracking section 24 shown in FIG. 10. In other respects, the configuration of the wireless communication device 10G is identical with the configuration of the wireless communication 10E shown in FIG. 10, and hence their explanations are omitted.

The decision feedback tracking section 24B controls tracking a received signal by means of decision feedback control. Specifically, the decision feedback tracking section 24B performs sync control using a modified costas loop or synchronization control using a hard decision "Decision-Feedback-Equalizer." In other words, the decision feedback tracking section 24B detects a synchronization error by feeding back an output to its input side, thereby performing control such that the error becomes smaller. In this regard, the received signal is processed as an unknown signal, equalization performance will become deteriorated in a situation where a method for modulating a payload is unknown.

Accordingly, in the wireless communication device 10G shown in FIG. 15, the control section 23E performs control such that the MCS generated in the header analyzing section 19 by decoding the header is given to the decision feedback tracking section 24B. By means of the MCS input from the control section 23E, the decision feedback tracking section 24B can ascertain a method for modulating the payload. A control error in the decision feedback tracking section 24B is reduced, whereby deterioration of synchronization performance is prevented.

In the wireless communication device 10G, the LDPC decoding section 18 shortens the time involved in decoding the header when compared with the time required in the related art. Accordingly, the MCS feedback from the header analysis section 19 to the decision feedback tracking section 24B can be practiced at an early stage of receipt processing of the payload of the received signal. Deterioration of synchronization performance can thereby be inhibited.

Although the embodiments have been described thus far by reference to the drawings, the invention is, needless to say, not confined to the embodiments. It is manifest that the persons skilled in the art can conceive various alterations or modifications of the embodiments within a category described in connection with the claims and that the alterations or modifications naturally fall within a technical scope of the invention.

This invention is based on Japanese Patent Application (Japanese Patent Application No. 2012-056115 filed on Mar. 13, 2012, the content of which is incorporated herein by reference.

DESCRIPTIONS OF THE REFERENCE NUMERALS AND SIGNS 10, 10B, 10C, 10D, 10E WIRELESS COMMUNICATION DEVICE
11 ANTENNA
12 WIRELESS RECEIVING SECTION
13 A/D CONVERSION SECTION
14, 14B SYNC SECTION
14C INITIAL SYNC SECTION
15, 15B, 15C COMBINING SECTION
16 BUFFER
17 DEMODULATION SECTION
18, 18B LDPC DECODING SECTION
19 HEADER ANALYZING SECTION
21 SOFT DECISION VALUE STORAGE SECTION
22 LDPC DECODING OPERATION SECTION
23, 23B, 23C CONTROL SECTION
24 TRACKING SECTION
24B DECISION FEEDBACK TRACKING SECTION
25 SELECTION SECTION
26 DECISION FEEDBACK EQUALIZER
100, 100B, 100C, 100D, 100E WAIT TIME CONTROL SECTION

The invention claimed is:

1. A wireless communication device configured to receive a signal with a frame format including a plurality of header sequences, comprising:
a combining section configured to combine header sequences of the plurality of header sequences;
a demodulation section configured to demodulate the combined plurality of header sequences;
a decoding section configured to decode the demodulated header sequences to acquire header information of the signal;
an initial sync section configured to perform initial synchronization by use of a preamble of the signal; and
a tracking section configured to perform synchronization tracking by use of a determined first known sequence included in a header of the signal, wherein
the combining section combines a first header sequence and a second header sequence of the plurality of header sequences having undergone synchronization tracking to acquire a first combined header sequence;
the demodulation section calculates first soft decision values of the first combined header sequence;
the decoding section detects whether or not the header information, obtained by subjecting the calculated first soft decision values to error correction decoding, includes errors;
the tracking section performs synchronization tracking by use of a second known sequence that is different from the first known sequence when an error in the header information is detected;
the combining section combines a third header sequence and a fourth header sequence of the plurality of header sequences that have undergone synchronization tracking to acquire a second combined header sequence;
the demodulation section calculates second soft decision values of the second combined header sequence; and
the decoding section detects whether or not the header information, obtained by subjected the second soft decision values to error correction decoding, includes errors.

2. The wireless communication device according to claim 1, wherein the decoding section subjects a payload of the signal to error correction decoding on the basis of the header information when an error in the header information is not detected.

3. The wireless communication device according to claim 2, comprising:
a decision feedback equalization section configured to subject the received signal to decision feedback equalization on the basis of the received signal and the signal modulated in accordance with a determined modulation method, wherein
the header information indicates the determined modulation method; and
the decision feedback equalization section subjects the received signal to decision feedback equalization according to the determined modulation method indicated in the header information.

4. The wireless communication device according to claim 2, wherein the header information indicates a determined modulation method; and
the tracking section adjusts an offset in timing at which the signal is received, on the basis of the determined modulation method indicated in the header information.

5. The wireless communication device according to claim 1, wherein the decoding section discards the received signal when an error in the header information is detected.

6. The wireless communication device according to claim 1, wherein the decoding section decodes the header sequences of the signal at an iteration count that is smaller than that used for decoding a payload of the signal.

7. The wireless communication device according to claim 1, wherein the decoding section continues decoding operation when an error in a determination is detected from a result of a parity check and halts decoding operation when no decision error is detected.

8. The wireless communication device according to claim 1 wherein the first header sequence is formed by error correction coding control information, and the second header sequence is formed by scrambling the first header sequence.

9. The wireless communication device according to claim 8, wherein
the first header sequence and the third header sequence are complementary to each other, and the second header sequence and the fourth header sequence are complementary to each other.

10. A method, comprising:
receiving, by a wireless communication device, a signal with a frame format including a plurality of header sequences;
combining, by the wireless communication device, header sequences of the plurality of header sequences;
demodulating, by the wireless communication device, the combined plurality of header sequences;
decoding, by the wireless communication device, the demodulated header sequences to acquire header information of the signal;
performing, by the wireless communication device, initial synchronization using a preamble of the signal; and
performing, by the wireless communication device, synchronization tracking using a determined first known sequence included in a header of the signal, wherein
the combining includes combining a first header sequence and a second header sequence of the plurality of header sequences having undergone synchronization tracking to acquire a first combined header sequence;
the demodulating includes calculating first soft decision values of the first combined header sequence;
the decoding detects whether or not the header information, obtained by subjecting the calculated first soft decision values to error correction decoding, includes errors;
the synchronization tracking uses a second known sequence that is different from the first known sequence when an error in the header information is detected;
the combining includes combining a third header sequence and a fourth header sequence of the plurality of header sequences that have undergone synchronization tracking to acquire a second combined header sequence;
the demodulating includes calculating second soft decision values of the second combined header sequence; and
the decoding detects whether or not the header information, obtained by subjected the second soft decision values to error correction decoding, includes errors.

11. The method of claim 10 wherein the decoding subjects a payload of the signal to error correction decoding on the basis of the header information when an error in the header information is not detected.

12. The method of claim 10, comprising discarding, by the wireless communication device, the received signal when an error in the header information is detected.

13. The method of claim 10, comprising:
subjecting, by the wireless communication device, the received signal to decision feedback equalization on the basis of the received signal and the signal modulated in accordance with a determined modulation method, wherein
the header information indicates the determined modulation method; and
the received signal is subjected to decision feedback equalization according to the determined modulation method indicated in the header information.

14. The method of claim 10, wherein the header information indicates a determined modulation method and the method comprises adjusting an offset in timing at which the signal is received, on the basis of the determined modulation method indicated in the header information.

15. The method claim 10, comprising decoding the header sequences of the signal at an iteration count that is smaller than that used for decoding a payload of the signal.

16. The method of claim 10, comprising continuing decoding when an error in a determination is detected from a result of a parity check and halting decoding when no decision error is detected.

17. The method of claim 10, wherein the first header sequence is formed by error correction coding control information, and the second header sequence is formed by scrambling the first header sequence.

18. The method of claim 17, wherein the first header sequence and the third header sequence are complementary to each other, and the second header sequence and the fourth header sequence are complementary to each other.

* * * * *